(12) United States Patent
Gaebler et al.

(10) Patent No.: US 8,258,557 B2
(45) Date of Patent: Sep. 4, 2012

(54) USES OF SELF-ORGANIZED NEEDLE-TYPE NANOSTRUCTURES

(75) Inventors: Daniel Gaebler, Ilmenau (DE); Konrad Bach, Tiefthal (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 389 days.

(21) Appl. No.: 12/443,261

(22) PCT Filed: Apr. 10, 2007

(86) PCT No.: PCT/EP2007/053487
§ 371 (c)(1),
(2), (4) Date: Dec. 31, 2009

(87) PCT Pub. No.: WO2008/037506
PCT Pub. Date: Apr. 3, 2008

(65) Prior Publication Data
US 2010/0117108 A1 May 13, 2010

(30) Foreign Application Priority Data

Sep. 28, 2006 (DE) .......................... 10 2006 046 131

(51) Int. Cl.
*H01L 31/062* (2012.01)
(52) U.S. Cl. .......... 257/292; 257/98; 257/293; 257/294; 257/432; 257/E31.127
(58) Field of Classification Search .................. 257/98, 257/292, 293, 294, 432, E31.127
See application file for complete search history.

(56) References Cited

U.S. PATENT DOCUMENTS

| 5,717,519 | A | 2/1998 | Sugiyama et al. |
| 5,949,188 | A | 9/1999 | Leising et al. |
| 6,052,213 | A | 4/2000 | Burt et al. |
| 6,091,021 | A | 7/2000 | Ruby et al. |
| 6,329,296 | B1 | 12/2001 | Ruby et al. |
| 2002/0089750 | A1 | 7/2002 | Hoshi |
| 2002/0135869 | A1 | 9/2002 | Banish et al. |
| 2006/0049476 | A1 | 3/2006 | Koizumi et al. |
| 2009/0050946 | A1 | 2/2009 | Duparre et al. |

FOREIGN PATENT DOCUMENTS

| DE | 103 52 423 B3 | 1/2001 |
| DE | 100 22 660 A1 | 11/2001 |
| DE | 102 39 643 B3 | 6/2004 |
| DE | 10 2004 003 340 A1 | 8/2005 |
| DE | 10 2004 036 469 A1 | 2/2006 |
| DE | 697 33 670 T2 | 4/2006 |
| EP | 0 854 662 A2 | 7/1998 |
| EP | 1 215 513 A1 | 6/2002 |
| EP | 1 245 968 A2 | 10/2002 |

(Continued)

OTHER PUBLICATIONS

K. Erler et al., "Preparation of rie textured silicon surfaces and application of typical solar cell processing," 17$^{th}$ European Photovoltaic Solar Conference; Oct. 22-26, 2001; Munich, pp. 1451-1454.

(Continued)

*Primary Examiner* — Tan N Tran
(74) *Attorney, Agent, or Firm* — Hunton & Williams LLP

(57) ABSTRACT

The invention relates to processes for the production and elements (components) with a nanostructure (2; 4, 4a) for improving the optical behavior of components and devices and/or for improving the behavior of sensors by enlarging the active surface area. The nanostructure (2) is produced in a self-masking fashion by means of RIE etching and its material composition can be modified and it can be provided with suitable cover layers.

37 Claims, 21 Drawing Sheets

FOREIGN PATENT DOCUMENTS

| | | |
|---|---|---|
| EP | 1 447 860 A1 | 8/2004 |
| GB | 2 238 114 A | 10/1989 |
| WO | WO 02/13279 A2 | 2/2002 |
| WO | WO 2004/021452 42 | 3/2004 |
| WO | WO 2005/053037 A1 | 6/2005 |
| WO | WO 2007/042521 A2 | 4/2007 |

OTHER PUBLICATIONS

Salleem H. Zaidi et al., "Characterization of random reactive ion etched-textured silicon solar cells," IEEE transaction on electron devices, vol. 48, No. 6; Jun. 2001; pp. 1200-1206.

International Search Report for PCT/EP2007/053487 mailed Oct. 12, 2007, 7 pages.

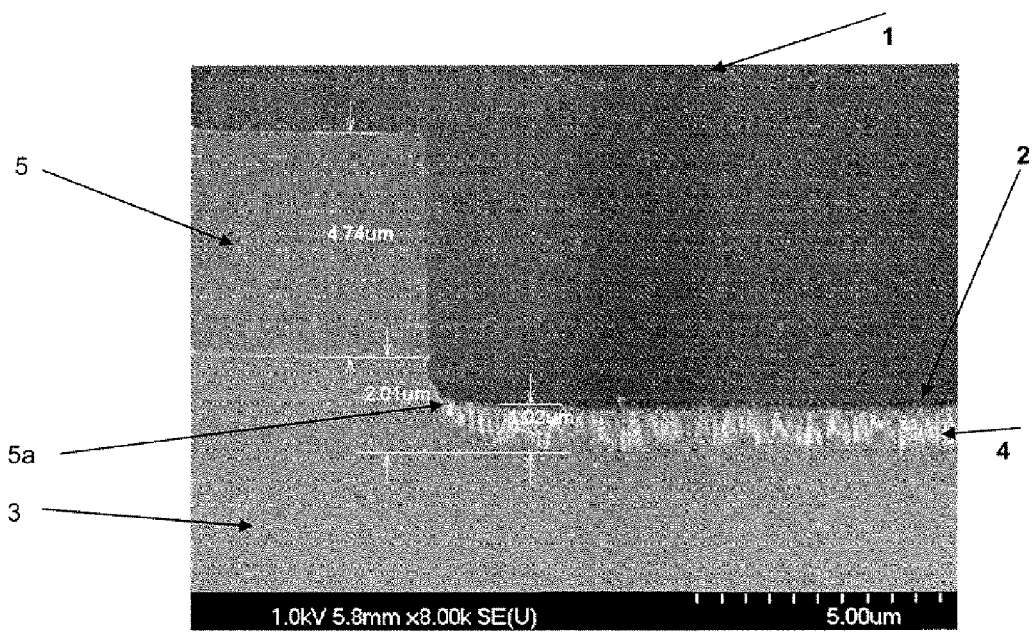
Fig. 1a
Fig. 1b
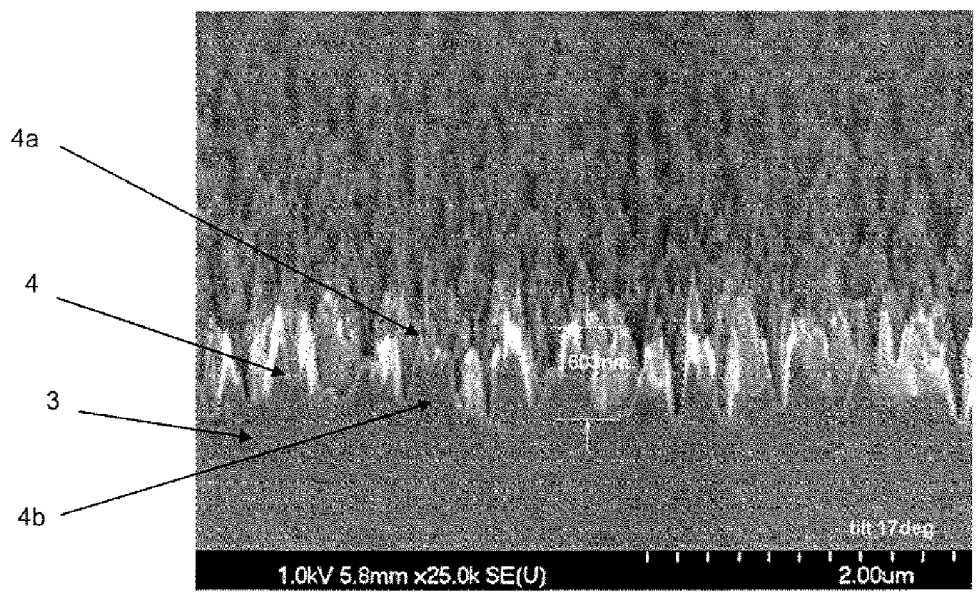

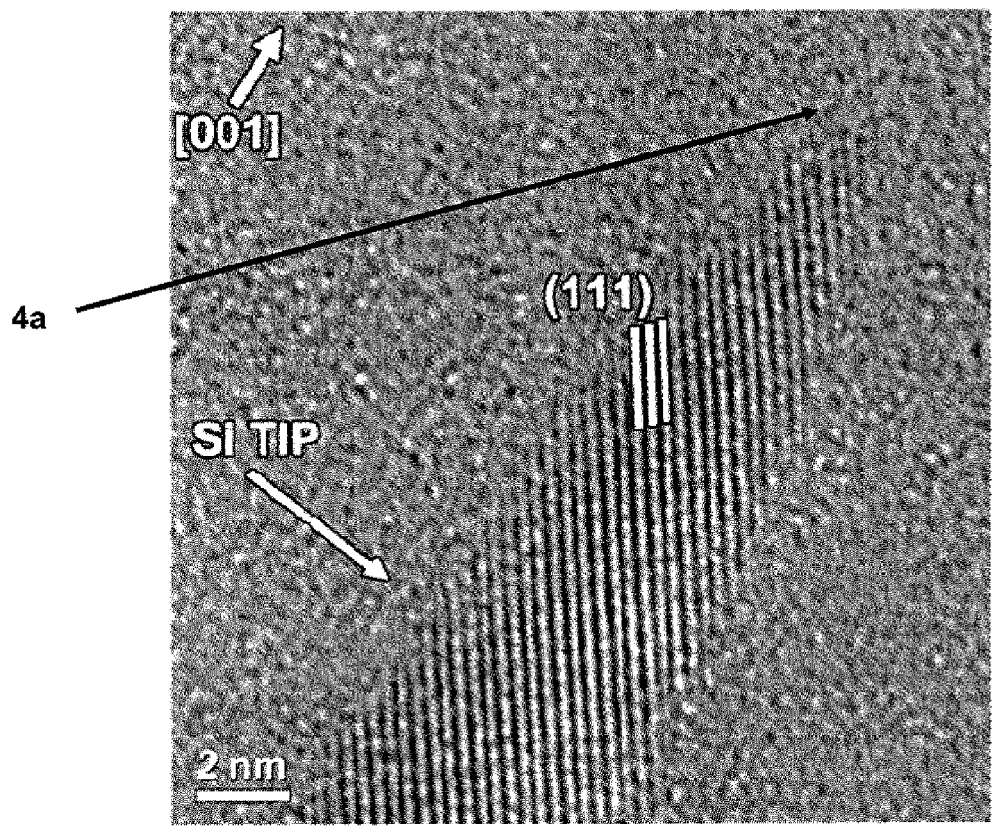
Fig. 1c
Fig. 1d
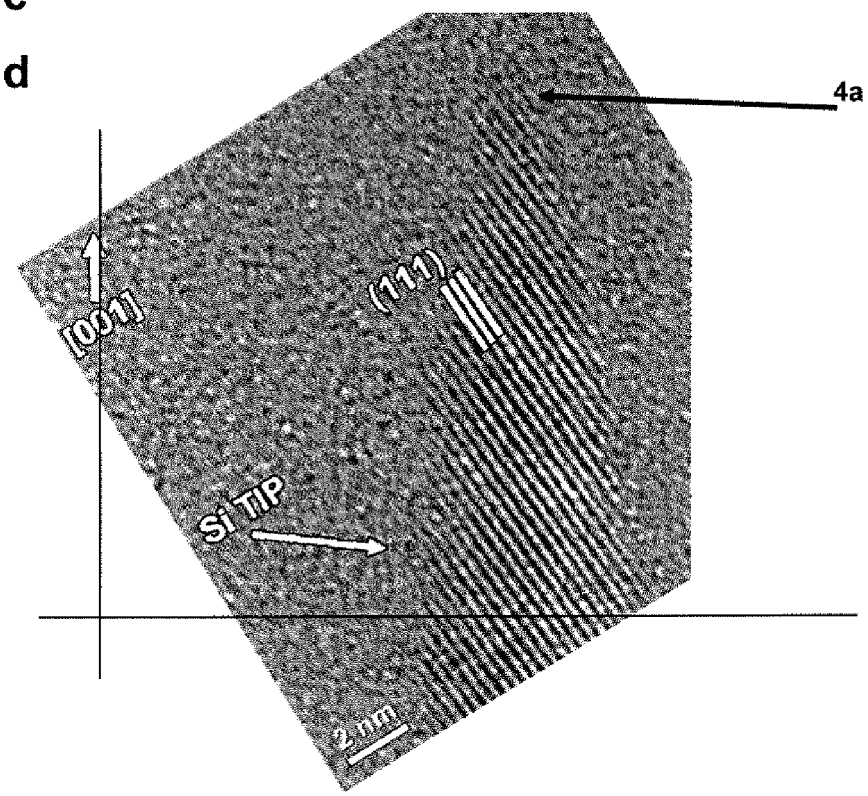

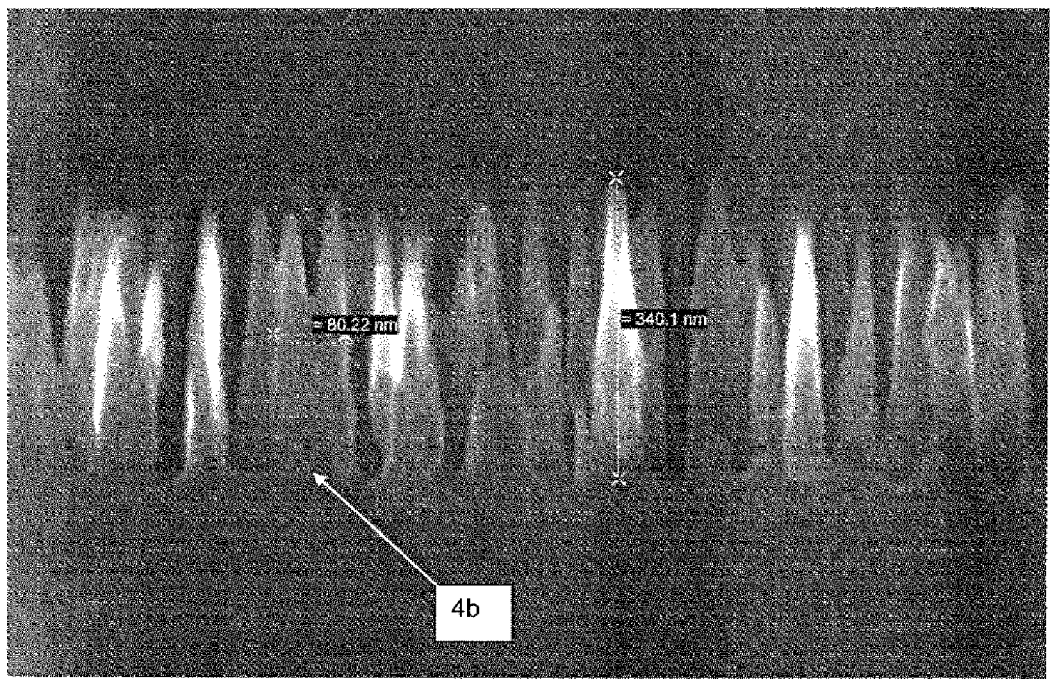
Fig. 1h
Fig. 1i
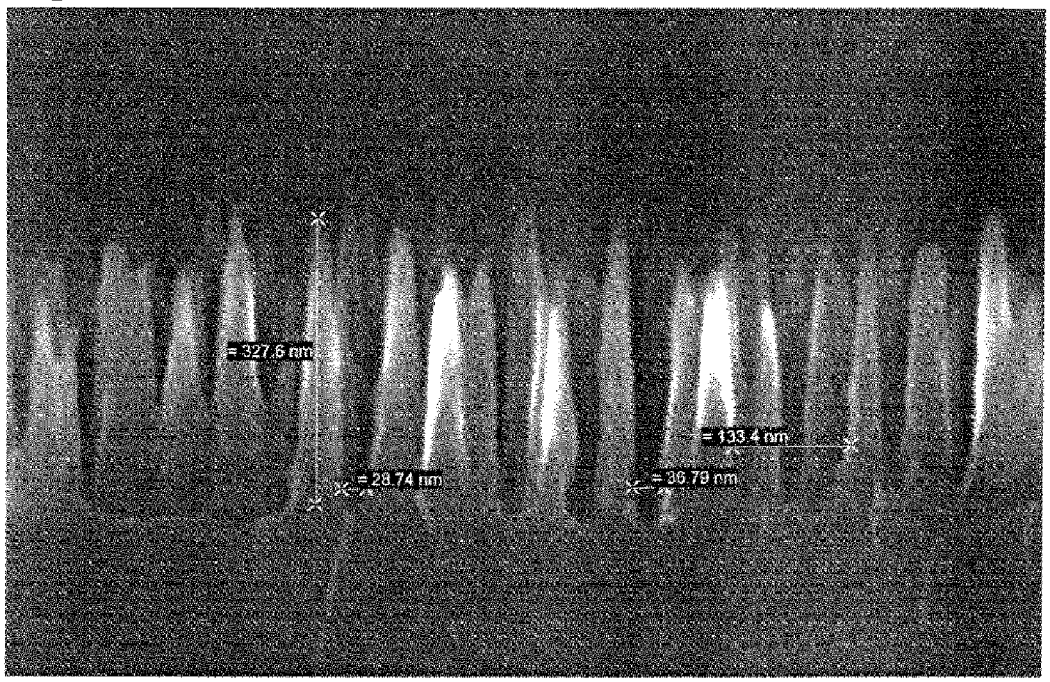

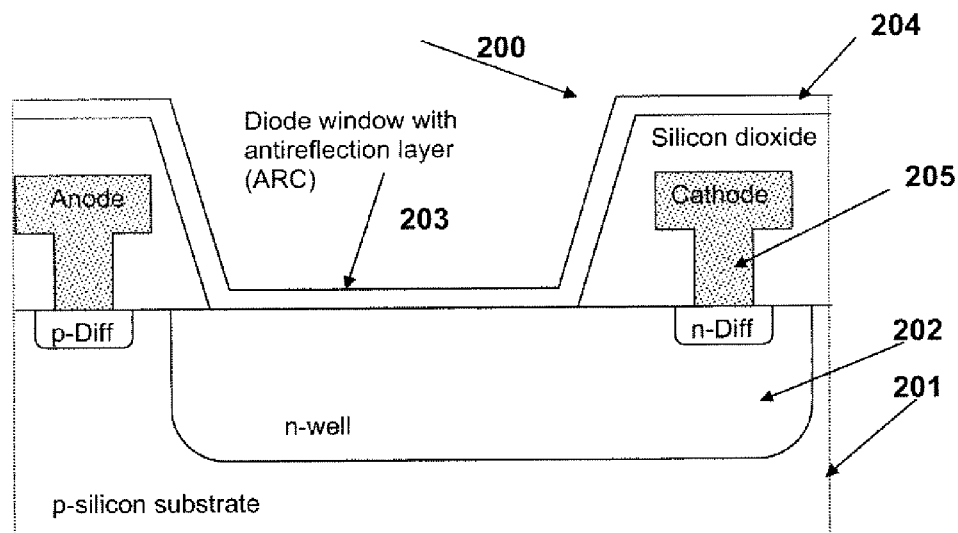
Fig. 2a
Fig. 2b
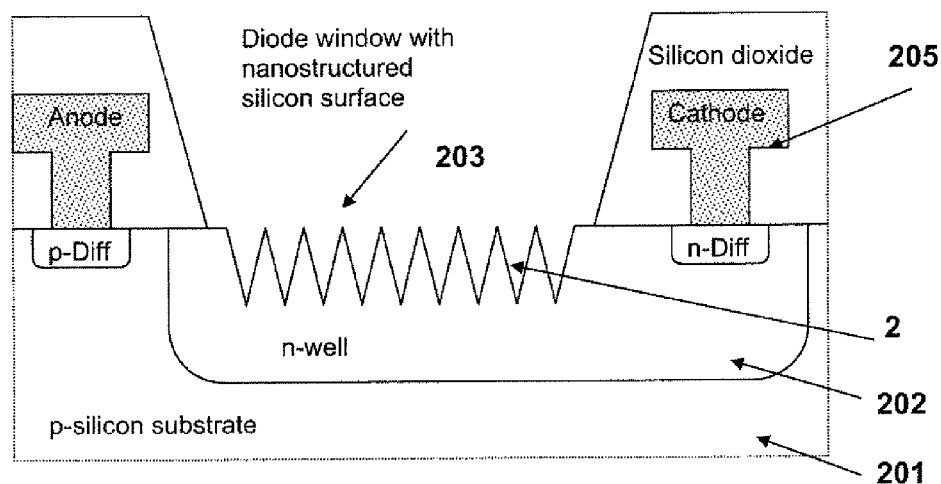

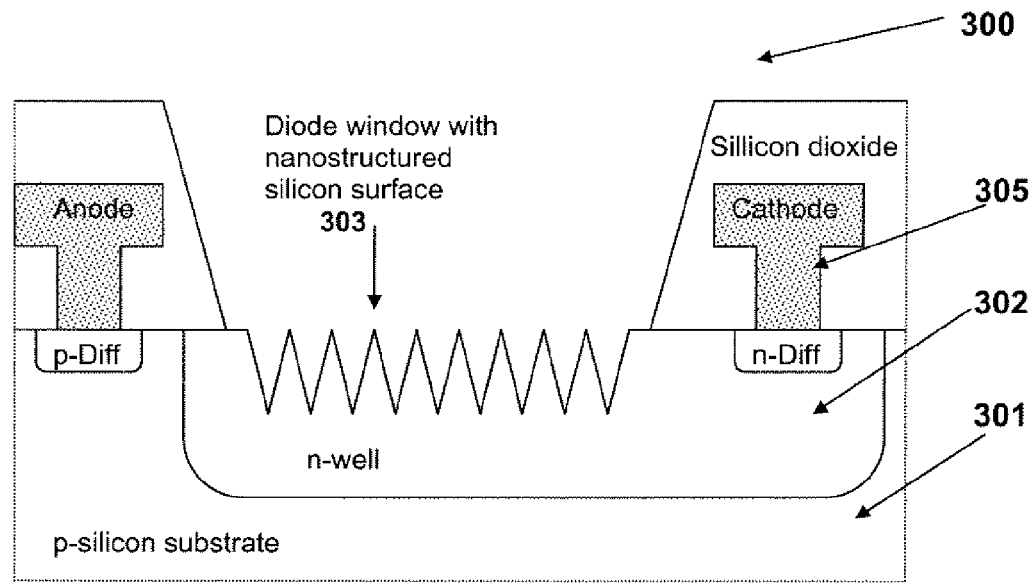
Fig. 3a
Fig. 3b
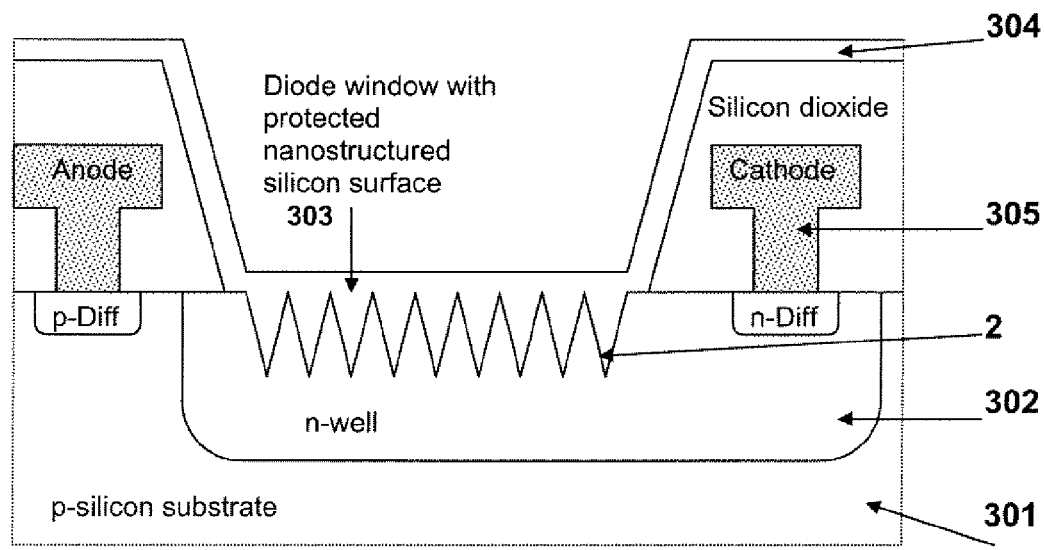

Fig. 4a
Fig. 4b
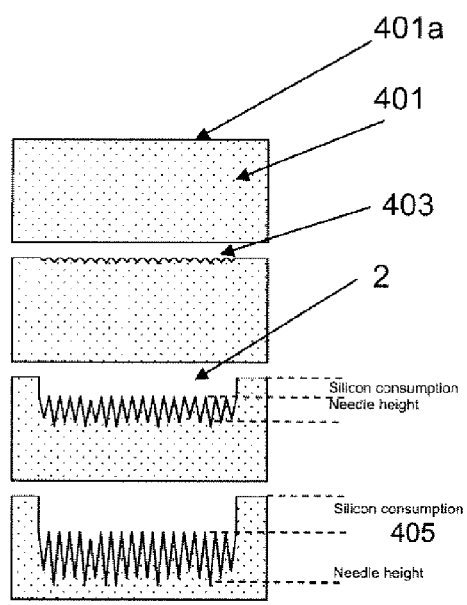
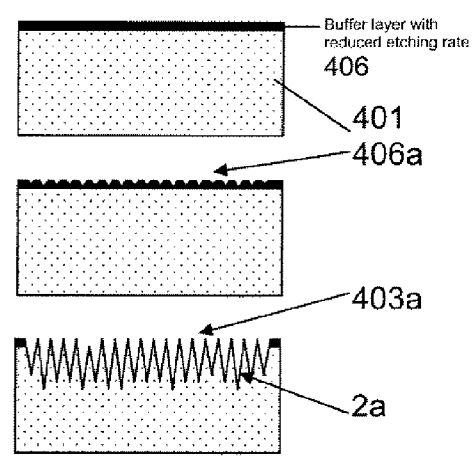

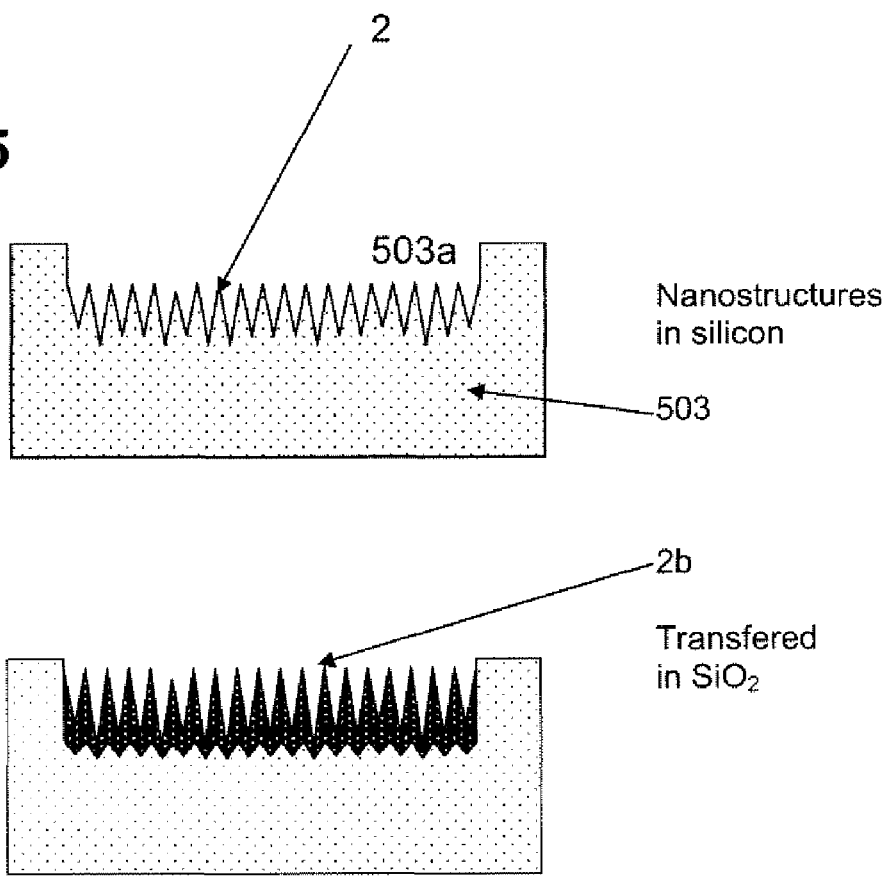

1     blank silicon
2     modified silicon surface

1   Theoretical transmission with only one completely antireflected surface
2   Measured transmission on a silicon wafer modified on one side.

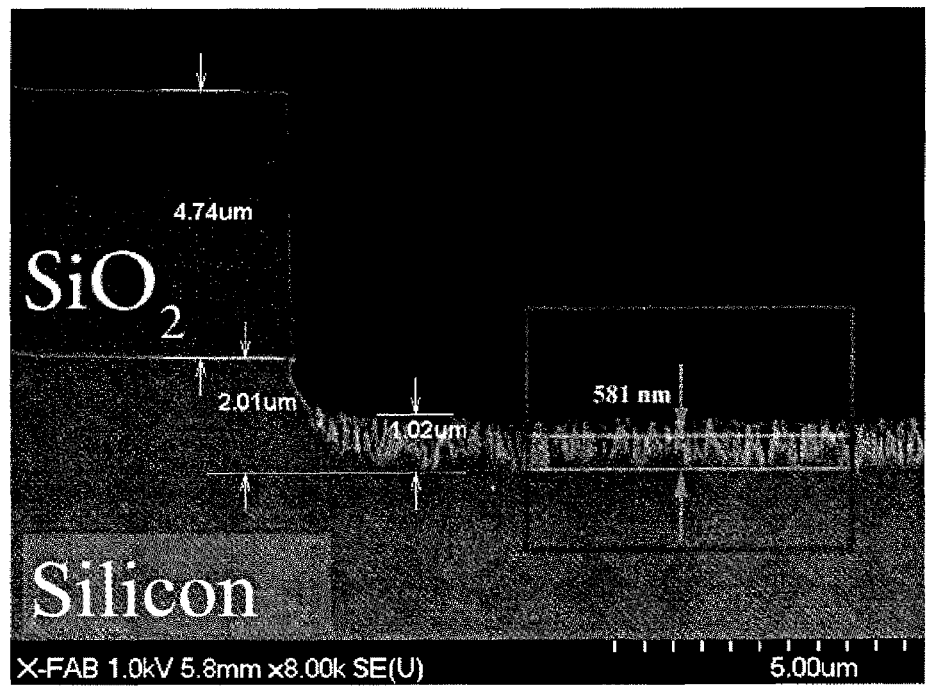
Fig. 9a
Fig. 9b
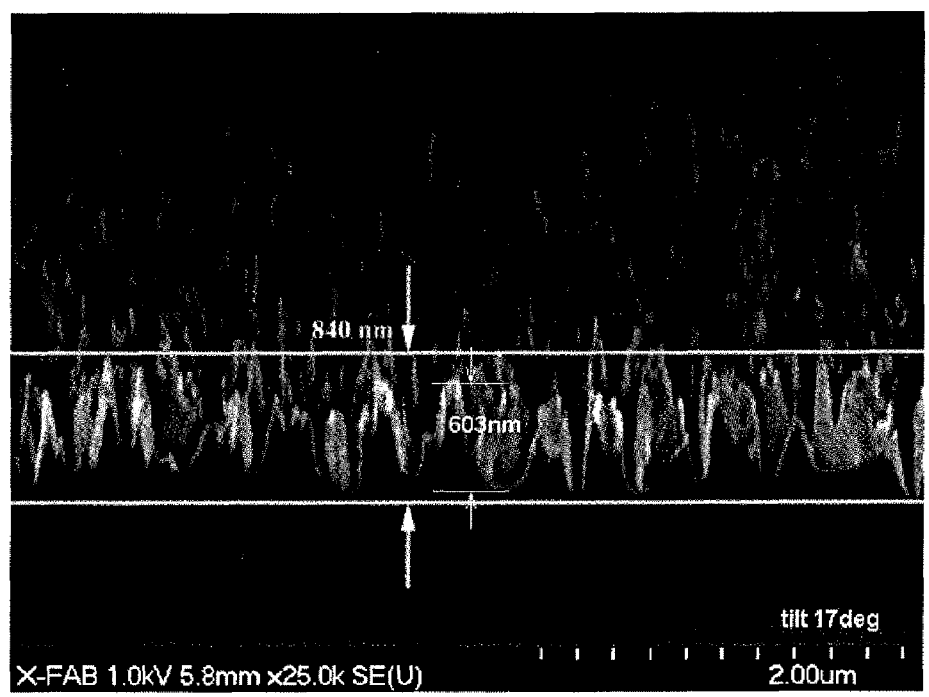

USES OF SELF-ORGANIZED NEEDLE-TYPE NANOSTRUCTURES

FIELD OF THE INVENTION(S)

The invention relates in general to the production of structured surfaces and in particular to the production of needle-type structures with nanodimensions, e.g., in the range below the wavelength of visible light, these structures being designated in the following as nanostructures. Their possibilities and technical applications are given special emphasis here.

BACKGROUND INFORMATION

Many electronic, optoelectronic, sensoric and micromechanical components have as a component silicon in doped and/or non-doped, crystalline and/or polycrystalline and/or amorphous form. In order to fulfill the component-specific requirements, silicon, may consequently be accordingly processed, which frequently includes a structuring of the silicon.

In general, a mask made of photoresist is made for the structuring of silicon, by means of which the removal by means of an etching process is controlled. In order to produce small structures by means of a photoresist mask, the photoresist may be exposed with an exposure mask having correspondingly small structures. In the range below the customary light wavelengths which are available for the exposure of the photoresist this may be possible with increased expenditure. However, structures with structural elements with a high aspect ratio are frequently used, i.e. the depth or height of the structural elements is large as compared with their lateral dimensions. If recesses and thus also elevations with nanodimensions with an aspect ratio of e.g. 2 are used on a silicon surface, a local removal of material may be carried out, which results in a recess of e.g. 200 nm with a lateral dimension of 100 nm. Consequently, the photoresist mask may also be produced with a comparable lateral dimension in an etching process on the basis of a photoresist mask and, moreover, it may have the necessary etching selectivity in order to also achieve the desired aspect ratio during the subsequent silicon etching process. Alternatively, high-resolution masks are also written with the aid of an electron beam (e-beam). These solutions have certainly a lot of uses, however, they also are very expensive. Consequently, constant efforts are made to find alternative processes which also make the structuring in the nanometer range possible.

However, in many conventional processes no high aspect ratio of the nanostructures is achieved, in particular if a low defect density is also desired. Thus, in the prior art, the nanostructure has typically an increased contamination density after production, i.e. undesired impurities on the surface and/or an increased number of crystal defects, if, at the beginning, monocrystalline silicon with a low crystal defect density was present. Consequently, these known processes can only be used in a restricted fashion or with poorer results in view of the total power behavior of the component. In some of these conventional processes plasma-aided processes with reactive ions on the basis of $SF_6$ (sulphur hexafluoride) and oxygen, which are also known as RIE processes, were used for the microstructuring using the self-organization for the production of structured silicon surfaces, the metal particles ensuring the micromasking and, thus, the structure formation, cf. WO-A 02/13279, U.S. Pat. No. 6,091,021 and U.S. Pat. No. 6,329,296.

A disadvantage of this process consists in the use of metals in the plasma, which may result in an undesired contamination of the silicon. The detrimental influences of the slightest metal traces in the semiconductor production process, in particular in integrated circuits, are known. In addition to the contamination effect of the RIE facilities due to the admixture of metal, the extra cost and effort of these processes for a use in production processes needing a high yield and low process costs may be assessed as being disadvantageous.

Due to the process engineering difficulties in the conventional production of structured surfaces and their further processing an application of nanostructures in components such as sensors, optoelectronic components and the like in an inexpensive and reliable fashion thus has not been common so far.

SUMMARY OF THE INVENTION

The present inventions are based on the object of indicating processes and components, the nanostructures being integrable in a reliable and inexpensive fashion with a simultaneous good processability and, at the same time, resulting in a power improvement of the components.

Under one aspect of the invention a process for the anti-reflection of photoelectronic components by means of self-organized nanostructures and corresponding components are indicated, wherein the production of suitable nanostructures is based on a process which will also be described in detail in the following. Here, structural elements are produced which have a height of less than 400 nm, which, thus, make a very good adaptation of the refractive index between two media possible and are suitable for use in a plurality of optical components as this will be shown in the following description. Under other aspects of the invention the nanostructures are produced in a layer with a thickness of from 200 nm to 1500 nm and used as an optical interface, light being efficiently coupled out of an optical component and/or coupled into the same. Here, the light passes through one or several layer(s) which are provided in a production-related fashion without these layers having to be especially structured, since, according to the invention, the transition from these layers and into the same can take place in a very low-loss fashion due to the providing of the nanostructures and, thus, the entire layer stack may serve as an interface. In particular, integrated components may be provided with metallization layers which do not require any subsequent reduction of the thickness above the optical windows of the optical components and where any restriction regarding the thickness and the number of the corresponding layers is also not necessary. If materials with very different refractive indices are to be used for the individual layers, a further adaptation layer may be provided between these materials so that, in all, a very low-loss coupling to the periphery can be carried out without the mechanical, electrical and chemical properties of the layer stack being impaired in the area of the optical window as compared with other component areas. The coupling of further optical components may then even take place on the whole area of the wafers or a further structuring may be carried out in order to apply suitable materials such as a transparent conductive material.

According to the invention an anti-reflection coating of photoelectronic components such as photodiodes, photocells and the like as a component of an integrated circuit or also as a discrete component is not carried out in a conventional fashion or is not exclusively carried out in a conventional fashion with λ/4 layers, but is alternatively or supplementally carried out by means of nanostructures produced by means of RIE etching, which have a far better broadband characteristic.

Photosensitive components in integrated circuits and as discrete components such as photocells serve for the conversion of light to electrical energy or vice versa. Photodiodes, for instance, are to convert light signals to electrical signals. A high sensitivity is desirable for these photosensitive components. Photodiodes, for instance, represent an integrable sensor in microelectronics, the surface of which is to be as small as possible and/or which is also to detect smallest amounts of light. Other components such as photocells are to have a high efficiency. It is advantageous in all cases to minimize reflection losses. In principle, the conversion of the photons to electrons takes place in the semiconductor material such as silicon itself. The charge carriers are sucked off by an electric field which is formed by a p-n junction. For this to take place, the photons may, however, first of all penetrate into the semiconductor such as the silicon. Due to the great differences of the impedances and/or the refractive indices of air and the semi-conductor material such as the silicon a plurality of photons are, however, reflected at the interface and do not get to the place of the conversion. Due to this, the sensitivity of the photodiode and/or the efficiency of the photocell is (are) reduced.

Now, there is no transition between air and semiconductor in an integrated photodiode, since semiconductor components are usually protected by a passivation layer. Frequently, this is an arrangement of air/$SiO_2$/Si or air/$Si_3N_4$/Si, if silicon-based components are considered. There is a three-layer system with two interfaces. The portion of the light which penetrates into the semiconductor is influenced by reflections at these interfaces and their interferences depends on the layer thickness, the material and the wavelength. In the most advantageous case (constructive interference for the transmission) a substantial amount of light can be used, in the most disadvantageous case (destructive interference) 30% to 50% are lost depending on the wavelength, i.e. almost exactly as much as is reflected by the blank interface of semi-conductor and air. Conventionally, the thickness and the material of the intermediate layer are selected in such a way that a constructive interference and, thus, a maximum anti-reflecting takes place, e.g. in accordance with DE-A 103 93 435.

However, there are still the following restrictions and/or disadvantages:
1. The layer thicknesses needs to be within very limited tolerances.
2. The anti-reflection is successful for a specific wavelength; other wavelengths are also found, which represent other interference orders for which a good anti-reflection is achieved; however, these are not freely selectable.
3. In order to reduce the reflection in a broad wavelength range to almost zero, an anti-reflection coating by simple $\lambda/4$ layers fails. Materials with finely graded refractive indices between 1 (air) and the corresponding maximum refractive index of the semiconductor such as silicon would be necessary for the wavelength range aimed at. For instance, the refractive index of silicon greatly depends on the wavelength, however, it is usually more than 3.5. However, such materials for adapting the refractive index are not established in the conventional semi-conductor technology and, thus, not available at present.
4. The applied layers need to have a very low absorption in the used wavelength range.

In typical fields of application for integrated photodiodes broadband light sources are generally not used, but, light-emitting and/or laser diodes. These emit with a specific wavelength and a conventional $\lambda/4$ anti-reflection layer could be adjusted to them. However, frequently, such integrated photosensors are to be used in the same design for different applications and these imply different light wavelengths. An example are the pick-up systems of modern combinational CD/DVD drives. They work at three different wavelengths (blue, red, infrared) in an optimum fashion without any redesigning, wherein these wavelengths can no longer be represented by different orders of constructive interferences. Even in the case of an optimum adaptation of $\lambda/4$ layers one does not succeed in obtaining a desired small reflection with the well established materials silicon dioxide and/or silicon nitride. In the case of silicon as the semiconductor material and the use of silicon dioxide as the intermediate layer a still too high reflection portion of 8% will at least remain. With nitride this portion in the visible wavelength range is clearly smaller, but the absorption is significant and, in turn, results in light losses for wavelengths of less than 400 nm.

The first solution according to the invention indicates a photoelectronic component which comprises an optically active window for the entering and/or exiting of radiation. Moreover, a nanostructure with statistically distributed structural elements with an end area and a base area, which is provided e.g. on a surface of the optically active window is formed in the component, wherein the average height of the structural elements is smaller than 400 nm. Moreover, the aspect ratio of the structural elements (height of the structural elements based on the lateral extension at the base area) is, on average, higher than four.

Thus, this aspect of the invention provides an anti-reflecting surface for integrated optoelectronic circuits and also discrete photoelectric components with little expenditure and, thus, at low cost, the disadvantages mentioned under items 1 to 4 being moreover also remedied or at least clearly reduced. Moreover, the structural elements can be produced efficiently with a high degree of stability and still an excellent optical behavior over a broad wavelength range in particular in the indicated range for the average height of the structural elements. A gradual adaptation of the refractive index between the window material and the surrounding medium is achieved with the defined nanostructure with the "needle-type" structures as the substantially "pyramid-like" structural elements which have an "atomically pointed" end area and a lateral extension becoming clearly broader towards the base area, it being possible that two or more tips may end in an individual base area. Since, in particular, the lateral dimensions are smaller than the wavelength of the visible range at the base area, the "mixture of materials" for the light can be considered as a "continuous" mixture, the share of the surrounding medium, e.g. air, increasing from the pure window material at the base of the structural elements with increasing height so that so that therewith substantially no interface with a discontinuous jump of the refractive index occurs for the light.

The nanostructure can be produced in a process that is compatible with a bipolar, CMOS or BiCMOS technology for integrated or discrete components as will be described in greater detail in the following. The nanostructure can be used alternatively or supplementally to an anti-reflection coating. It is not more expensive than the same, but has an anti-reflection of a good quality, which is wavelength-independent over a broad wavelength range. Thus, the entire wavelength range that is of interest for silicon photodiodes is covered in one embodiment. A further advantage of the anti-reflection coating by means of the nanostructure described above is its low dependence on the incidence angle as compared with $\lambda/4$ layers or regular structures.

These needles with the indicated height range of less than 400 nm can be subjected to considerable mechanical strains so that they can directly serve as an adaptation layer for the refractive index or an anti-reflection layer, if silicon also serves as the base material or further steps are needed, such as the application of a passivation material, the use as a nanotemplate for the production of needle-type tips in other materials, oxidation processes and the like. The nanostructures are at most bent or "smeared", but not destroyed, in the case of a corresponding strain. Mechanical strains of the following type do not result in a destruction of the nanoneedle structure so that, therewith, detrimental consequences regarding the reflection of the nanostructure with the pyramid-like needles are substantially avoided:

uniform surface-distributed pressure vertically on the needles

AFM in the contact mode profilometer

A profilometer needle of the profilometer exerts a pressure of from 0.1 to 10 mg on the sample to be measured (the nanosurface with the pyramidal needles). The profilometer needle is very pointed, but its diameter increases rapidly so that a 5 μm deep recess with a width of 1 μm can no longer be exactly resolved in the measuring picture during its movement on a measuring sample. In the case of a pressure of normally 5 mg and a movement of the profilometer needle with a speed of up to 100 μm/sec. on the nanostructure no detrimental influence on the reflection properties of the nanostructure was detected as it would occur in a destruction of the pyramidal needle structure.

In all, it was possible to prove a very advantageous anti-reflection behavior in the visible range and also up to a wavelength of up to 3000 nm or more on corresponding surfaces such as on bent surfaces of microlenses, for instance, etc. for the formed (plane) nanostructure already at an average length or height of the structures of somewhat less than 400 nm and in particular in a range of less than 400 nm to 300 nm. As will be described in the following larger average heights can also be produced and used as this is shown in connection with the optical interfaces.

This property, as well, indirectly defines the structures of the "pyramid-like needles". A substantial portion of the reflection is less than 0.7% for a wavelength range of from 400 nm and approx. 800 nm (scattered and direct reflection). In an extended range of from 180 nm to 3000 nm the reflection is less than 2%, practically the scattered reflection contributing to this. The reflection is a physical property of the nanostructure which is reproducible, measurable and comparable with another structure.

By way of a non-limiting example, investigations suggest that the efficient self-organized masking (as a "self-masking") is achieved by the etching process itself and not by already present or especially added substances. Corresponding investigations on the basis of the Auger electron spectroscopy (AES) and the energy dispersion X-ray spectroscopy (EDX) indicate that the masking effect is caused by $SiO_x$ so that a high shielding effect is achieved by the locally formed silicon oxide. All in all, this results in a moderately low silicon consumption during the production of the needle-type structure with a "pyramid-like form" with a simultaneously high aspect ratio and existing interspace so that the process according to the invention can be advantageously and efficiently used in the semiconductor production in many fields with a high degree of process compatibility.

No defects may be used for the targeted mask formation. Thus, the self-organized masking caused by the special process conditions during the etching process, which is described above, replaces the specific masking prior to an etching process. Thus, the production of self-organized pyramid structures in the nanometer range is made possible by the plasma due to the combination of the self-masking with the etching during the RIE process. Due to this it is possible to convert a smooth silicon surface to a needle structure in the nanometer range, which is in statistical respect regular, more or less ordered, i.e. with lateral dimensions in the range below the customary light wavelengths, e.g. the wavelength range of the visible light. All in all, an excellent homogeneity of the reflection behavior is achieved for optical windows and also across a globally bent surface, i.e. the radius of curvature is a much larger than the lateral dimensions of the nanostructures.

Moreover, it is achieved in a single etching step to clearly reduce both the number of the contamination defects which are e.g. customarily caused by etching byproducts and crystal damage which are found in conventional plasma-aided processes or to substantially avoid them within the framework of the measuring accuracy. Thus, such defects—due to the etching regime according to the invention—could neither be proved with RHEED, CV measurements, TEM or PDS (photo thermal deflection spectroscopy). A simple photodiode, e.g. blue light, whose surface was treated with this process did also not have any special features which point to increased defect densities. Thus, the produced nanostructure can be made available by a single plasma etching step in a to quality which does not require any further removal of material.

As is explained in still greater detail in the following the property is very advantageous in the use of the nanostructure in photodiodes or photocells, namely that the nanostructure, if it is made of a semiconductor material such as silicon, can achieve a high degree of "freedom from defects" of the used areas, i.e. substantially no additional crystal defects are caused in the case of the production of the structural elements by means of plasma etching. Thus, the produced pairs of electron/hole do not find any additional recombination centers and can still be efficiently sucked off through the electrical field that is formed in the p-n junction so that no serious reduction of the sensitivity is caused.

In a further embodiment the photoelectronic component further comprises a passivation layer which leaves the optically active window free and forms a boundary with it, the structural elements substantially extending up to the boundary. Thus, the effective area of the nanostructure can be defined locally in a precise fashion by means of this measure, it being possible to use well established masking processes, for instance. Here, the formation of the structural elements substantially also takes place at the boundary area between the passivation layer and the nanostructure, which may be understood in such a way that the structural elements reach up to the passivation layer at least up to a distance which corresponds to half the thickness of the passivation layer. Even in the case of a distinct step which may be caused by the passivation layer an extensive surface covering of the window by the structural elements is still achieved and, thus, the high degree of anti-reflection is maintained during the entering and exiting of radiation.

In one embodiment the structural elements are built up from monocrystalline semiconductor material. The electrical function of the component can thus remain substantially uninfluenced by the nanostructure. As already mentioned above the effect of the charge carriers can be maintained, the coupling of the radiation being clearly improved. Moreover, the nanostructure may also be directly produced in the semiconductor material considered, it being possible that the composition and the doping can already be previously fixed. If needed, the nanostructure may also be formed in an early phase of the production process, certain properties of the semiconductor material such as doping, composition, etc. being adjusted at a later point in time. For this purpose, the nanostructure may be "preserved" in a suitable material such as silicon dioxide so that complete curing processes, implantation, introduction of other types of atoms, e.g. germanium, into a silicon base semiconductor, etc. may be carried out with a high degree of compatibility to conventional processes.

In an embodiment the nanostructure has a monocrystalline base layer on which the structural elements are disposed. A crystal defect density of the structural elements is substantially equal to the crystal defect density of the base layer. Thus, the quality of the semiconductor base material can also be made available in the structural elements.

In one embodiment the semiconductor material is silicon. In this case an efficient self-organized etching process as it is described in detail in the following can be directly used in a silicon-based component. A silicon layer may be applied in a crystalline or polycrystalline or amorphous state in other cases and the nanostructure can then be efficiently produced in it by means of etching. The above-mentioned can also be achieved in a polysilicon wafer.

In an embodiment the structural elements are at least partly built up from an insulating material. Due to this, an electrical passivation can be achieved in cases in which an influencing of the electrical behavior of a component is not desired or a high degree of resistance to a plurality of environmental media is desired. For instance, the insulating material may be silicon dioxide, silicon oxynitride or silicon nitride.

In one embodiment the height of the structural elements is in the range of from 300 nanometers to less than 400 nanometers. Excellent optical anti-reflection properties in the visible spectrum and also in the infrared range result with these dimensions in the height direction in combination with the lateral dimensions specified above.

In a further embodiment the photoelectronic component moreover comprises a leveling layer in the optically active window, the structural elements of the nanostructure being embedded in the leveling layer.

The leveling layer which may also be designated as a protective layer fills the hollow spaces between the needle-type structural elements to be protected, e.g. silicon tips, so that the structural elements are stabilized. Thus, a closed layer is formed for the further processing. Mechanical strains can be absorbed with little risk of a destruction of the nanostructure due to the smooth surface produced in this fashion. It is a lot easier to apply a further layer onto this smooth surface and to also remove it again.

Depending upon the used material this protective layer intervenes in the functioning of the nanostructure in a different fashion. The surface-enlarging function of a nanostructure is completely or partly prevented by a dense layer. However, a porous layer can be used for letting only certain substances pass to the surface of the nanostructure, which plays a part e.g. in the case of chemical sensors. It is advantageous for all optical applications that the properties of reflection and transmission or also of scattering are only slightly deteriorated or even improved. For this purpose, the layer comprises a low absorption. Reflection losses remain at a minimum if the refractive index is as close as possible to the refractive index of the surrounding medium such as air. In one embodiment the refractive index of the material of the leveling layer is e.g. 1.5 or less.

Moreover, a second nanostructure is provided on a second surface of the optically active window in a further embodiment. This is of advantage in applications in which the optical window is not directly produced in the base material of the component or if recesses in the base material need to be covered by the window. A suitable window can e.g. be produced on a separate substrate and, subsequently, transferred to the component. The nanostructure and the second nanostructure are advantageously embedded into a protective layer.

Under a further aspect of the invention a sensor component is made available. The sensor component comprises a sensor surface which is formed by a nanostructure with statistically distributed structural elements, the structural elements having an end area and a base area and the average height of the structural elements being smaller than 400 nm. On average, the aspect ratio of the structural elements (the height of the structural elements to the lateral extension at the base area) is greater than 4.

The surface of the sensor surface is clearly enlarged by the providing of the nanostructure so that a higher responsiveness is achieved. Moreover, the residence time near the sensor surface can be prolonged in the case of volatile media such as gases. If, moreover, optical processes are used for detection, the sensor surface can at least partly also be used as an optical window, the advantages described above being achieved in addition to the improved sensor behavior.

In one embodiment the nanostructure of the sensor component is formed from an insulating material such as silicon dioxide or the like. In other embodiments the sensor component also comprises a porous leveling layer for embedding the nanostructure. A high mechanical stability and also a protection against environmental influences are achieved in this fashion, the porosity of the filling material still making a contact of the surface with certain substances possible.

Under a further aspect of the invention an optical coating structure to be used in optical components or optical devices is made available. The optical coating structure comprises a base layer and a nanostructure with statistically distributed structural elements, which is applied onto the base layer. The structural elements have an end area and a base area, the aspect ratio of the structural elements, i.e. the height of the structural elements and the lateral extension at the base area, being, on average, greater than 4 and the height is less than 400 nm.

The coating structure according to the invention can be used in a plurality of components and devices, it being possible to clearly improve the absorption behavior and/or the emission behavior due to the aforementioned properties of the nanostructure formed in the coating structure. The optical coating structure can be separately produced, e.g. on silicon surfaces and can then be installed in the actual application with suitable carrier materials.

In a further embodiment the optical coating structure comprises a conformal metal layer on the structural elements so that the absorption behavior and/or emission behavior of the nanostructure can be adjusted irrespective of the base material of the structural elements of the nanostructure. In one embodiment the metal layer serves for the targeted heat output. Thus, the cooling effect of components can be clearly improved by the improved emission of heat radiation achieved by the nanostructure and the metal layer, whereby, all in all, small building volumes are made possible.

Under a further aspect an optical device with a lining is made available as an optical broadband absorber, the lining comprising an optical coating structure of the type described above.

Under a further aspect a digital projector with mirror technology (digital light processing) with an absorption surface is made available, which comprises an optical coating structure of the type described above.

Under a further aspect a device with a means for the wavelength-independent conversion of optical radiation to heat is made available, the means for converting optical radiation to heat comprising an optical coating structure of the type described above.

Under a further aspect an optical element for emitting optical radiation with an exit window is made available, which comprises an optical coating structure of the type described above. In one embodiment the exit window is coupled to a light-emitting diode or a LASER.

Under a further aspect a reflection reference means for determining low reflection values is made available, the means comprising an optical coating structure of the type described above.

Under the aspects described above the versatility of the nanostructure according to the invention is advantageously used in different applications in order to improve the power behavior of many optical devices.

Under a further aspect of the present invention a photoelectronic component with a reflection-reducing layer of statistically regularly distributed silicon needles, which are poor in crystal defects and have a height of less than 400 nm and an aspect ratio of more than 4:1, said layer being provided with an optically active window area, is made available.

In this case, as well, the silicon needles result in an improved power behavior in view of the coupling out and/or coupling of radiation in a broad wavelength range, the low amount of crystal defects not influencing the electronic behavior to a significantly negative degree. With a height of less than 400 nm and in particular of 300 nm and greater and less than 400 nm an excellent anti-reflection for visible light can be achieved.

The silicon needles may have a tip whose lateral extension is less than 10 nm. Thus, the tip of the silicon needles can be designated as "atomically pointed." In connection with these small dimensions of the end areas of the silicon needles the base area of the silicon needles may have a lateral extension of 50 nm or more, whereby, on the one hand, an advantageous "pyramid-like form" of the needles is generated and, on the other hand, the lateral dimensions at the base of the needles still remain below the wavelength of the visible light. Here, two or more tips may end in a single base area so that, on average, a gentle adaptation of the average amount of material of the structural elements takes place towards the base layer and likewise a gentle transition towards the surrounding medium takes place. The pyramid-like needles are not arranged too densely. The interspace has a width of at least 20 nm. In this fashion, a quasi-continuous distribution of material for the wavelength range that is of interest is generated so that a continuous change in the refractive index is achieved along the height direction of the silicon needles. Thus, a constant change in the refractive index takes place for radiation in the visible range, which passes the nanostructure in the height direction without substantially discontinuous boundary surfaces being found which would result in a high reflection.

In one embodiment the photoelectronic component has a passivation layer which leaves the active window area free and forms a boundary with it, the silicon needles being formed up to a distance to the boundary, which is smaller than half the thickness of the passivation layer.

Under a further aspect of the invention an optical window is made available, which comprises silicon and has a broadband transparency in the IR range, wherein at least one, or both surfaces of the window have needle-type structures in nanodimensions with an aspect ratio higher than 4:1.

As already described above in connection with the optical coating structure the optical properties of devices and components can be improved, which use an radiation exchange with infrared radiation. Here, both the entry surface and the exit surface of the window are provided with a nanostructure on at least one, or both sides which, thus, results in a quasi-continuous change in the refractive index in the propagation direction of the radiation and thus clearly reduces reflection losses.

In one embodiment the needle-type structures with nanodimensions are protected against a mechanical action with an SOG layer (spin-on glass). Thus, the optical window can be effectively protected against mechanical or also other environmental influences during the final phase of the production and during the further processing, e.g. during the assembly in a device or a component. The protective material may comprise hydrogen-silses-quioxane (HSQ), due to which a good processing with favorable optical properties such as a low refractive index and little absorption results.

In one embodiment the needle-type structures with nanodimensions are limited to specific areas of the window by means of a conventional masking technique so that, thus, untreated, mechanically stable areas remain, which can be sealed against air, liquids and vacuum in a simple fashion. Thus, the optical window can be used in many application situations in a very flexible fashion.

Under a further aspect the invention relates to a process for the adaptation of the refractive index of an optically active window of a photoelectrical component. The process comprises the production of a nanostructure in the surface area of the window, in particular in the surface area of the window by means of a self-organized plasma etching process for etching a silicon base layer and the adjustment of an aspect ratio of structural elements of the nanostructure, which are produced in the silicon base layer, to a value of four or more as a function of an operating wavelength range of the photoelectrical component, the average height of the nanostructure being adjusted to less than 400 nm. Then, the operating wavelength is the specification of the photoelectrical component, thus, one of its properties.

A high degree of compatibility with many production processes in the semiconductor industry is achieved by using a self-organized plasma etching process for the production of nanostructures as they were already described above. Here, an adaptation of the optical properties to the requirements to be met to the photoelectronic component can be efficiently achieved by means of the adjustment of the aspect ratio by suitable means as they will be described in the following.

In one embodiment the needle-type structural elements (in the aforementioned sense) are produced in a single process step during the plasma etching process by using the working gases oxygen ($O_2$) and sulphur hexafluoride ($SF_6$) without the use of additional means for the targeted mask formation, the silicon base layer being kept at a constant temperature in the range of substantially 27° C., in particular also covering the ±5° C. range, during the process, and it being worked with a plasma output ranging from about 100 to 300 watt, higher plasma outputs being adjusted at higher process pressures and the ratio of the working gas flows being adjusted as a function of the geometrical parameters of the facility so that the oxygen shows a self-masking effect in the reaction point on the silicon base layer, which can be achieved in the range of the gas flows for $SF_6$ at 50 to 150 sccm and for $O_2$ at 20 to 200 sccm and the process time amounts to a few minutes.

With this embodiment needle-type structural elements in the nanostructure (in the above sense) can be produced on the silicon surfaces with a high aspect ratio and with nanodimensions, the expenditure for the masking being avoided or reduced and an improved behavior being achieved as regards crystal defects and chemical surface impurities as compared with conventional processes and a high degree of compatibility with further production processes being achieved. For this purpose, a reactive plasma atmosphere with two different gas components as a maximum, i.e. with oxygen and a reactive $SF_6$ gas is generated for etching silicon by adjusting process parameters, which develop a self-masking effect for producing a nanostructure. Here, the etching process takes place without any further working gases and is carried out as a one-step process, i.e. the silicon surface is subjected to the influence of the etching plasma after the generation of the plasma atmosphere without any further process steps taking place. Particularly, no further measurements are taken in order to achieve a targeted micromasking of the silicon surface. Moreover, the aspect ratio of the needle-type structures formed in the plasma atmosphere is adjusted to a value of 4 (four) or more by controlling the process time.

Thus, a masking of the Si surface, by photoresist or other substances such as aluminum, gold, titanium, polymers, water or any surface impurities, etc. can be renounced according to the invention. The needle-type structures produced by the process according to the invention have a form that is suitable for optical application purposes in the range of visible light and also in the infrared range, a form of the needle-type structures being formed by the self-organized masking of the etching which, in addition to the aspect ratio of more than 4, also has a "pyramid-like" section, a needle end that tapers to a very pointed point is formed, but, at the base of the "needle-type structure" a relatively flat ending area is produced on average across many needles, in particular since many structural elements are produced as elements with at least two tips and a single base area.

It was possible to prove a very favorable anti-reflection behavior in the visible range and also up to 3000 nm and more for the formed nanostructure with an average length or height of the structures of less than 400 nm. The efficient self-organized masking (self-masking) may be achieved by the etching process itself and not by already existing or especially added substances. In one embodiment, observations of Auger electron spectroscopy (AES) and the energy dispersion X-ray spectroscopy (EDX) may indicate that the masking effect is caused by $SiO_x$ so that a high shielding effect is achieved by the locally formed silicon oxide. This may result in a moderately low silicon consumption during the production of the needle-type structures with a simultaneously high aspect ratio so that the process according to the invention can be used in an advantageous and efficient fashion in the semiconductor production with a high degree of process compatibility.

Substantially, no defects are used for the targeted mask formation. Thus, the self-organized masking caused by the special process conditions during the etching process, which was described above, replaces the targeted masking prior to an etching process. Thus, the production of self-organized pyramid structures in the nanometer range is made possible by the plasma due to the combination of the self-masking with the etching during the RIE process. Due to this it is possible to convert a smooth silicon surface to a statistically regular, quasi-ordered needle structure in the nanometer range, i.e. with lateral dimensions in the range below the customary light wavelengths, e.g. the wavelength range of visible light.

Moreover, it is achieved with the process according to the invention to clearly reduce to both the number of the contamination defects which are customarily caused by etching by-products and crystal damage found in conventional plasma-aided processes in a single etching step or to substantially avoid them within the framework of measuring accuracy. Thus, such defects could neither be detected with RHEED, CV measurements, TEM or PDS. Even a simple photodiode whose surface was processed with this process did not exhibit any particularities suggesting increased defect densities. Thus, the produced nanostructure can be made available by means of a single plasma etching step in a quality which does not require any further removal of material.

The structures produced with the process do not exhibit any marginal shading at high edges. Thus, it is possible to structure surfaces having a size of a few μm (micrometers), even if the surface is enclosed by a 5 μm high structure.

The structuring of the silicon is effected by the plasma in the RIE process. These structural elements are greatly deepened by the etching process, whereby, as a result, the structures in the nanometer range with enormous aspect ratios result.

If a working gas consisting of $SF_6$ and $O_2$ is used the needle-type structures with a low defect rate, i.e. a low crystal defect density and a low surface contamination, result irrespective of the crystallographic orientation of the silicon base surface, whereby a high degree of flexibility for including the process according to the invention in corresponding production processes for silicon containing components is made available.

Another working gas combination with $O_2$ as a component is used in other embodiments. Carbon fluorides ($C_nF_m$ with n being e.g. 1, 2 or 4 and with m being e.g. 2, 4 or 8) can be used in connection with oxygen as the second gas component. $SF_6$ or the other aforementioned reactive gases are in each case the second of the two gas components in addition to oxygen and in this case the actual etching gas, whereas $O_2$ increases the etching rate and brings about the self-masking (passivation). It also provides for a high selectivity to $SiO_2$ in the etching behavior so that an efficient limiting of the silicon surface to be structured is possible by means of a corresponding mask layer.

The temperature of the silicon base layer and the ratio of the working gases at the reaction point on the Si surface are adjusted in a suitable fashion. Thus, it is possible to efficiently adjust the further process parameters such as the specified flow rates, since the temperature which typically represents a "sensitive" parameter is predetermined in a very exact fashion.

The process pressure and the plasma output are also adjusted to each other in a suitable fashion in order to obtain the desired aspect ratio with a simultaneously reduced contamination rate and a low crystal defect density.

Maintaining the oxygen component in the indicated fashion the ratio of the working gases is in particular adjusted so that the removal by etching and the self-masking counterbalance each other. Due to this, both the structuring in the defined sense and a "freedom from defects" is achieved.

The absolute parameter values can be efficiently adapted to the portion of the open silicon surface in the process according to the invention. If a high surface portion of the Si surface is covered by a mask layer, e.g. oxide or silicon nitride, this can be compensated by an increase in the share of the reactive gas, e.g. in the share of $SF_6$, in particular also in case of an increase in the share of $SF_6$ with a simultaneous reduction of the share of oxygen and with a simultaneous increase in the process pressure.

It is possible due to the process described above to produce nanometer structures with high, changeable aspect ratios in a short period of time by means of a simple RIE facility with a parallel plate reactor. This is possible on a large surface and, with a targeted adaptation of the process parameters, also in smallest areas so that individual components such as sensor areas, optically active areas of optoelectronic components and the like can be provided with a corresponding nanostructure in a targeted fashion without other component areas being detrimentally influenced. Areas which are not to be structured can be protected in a simple fashion, e.g. by means of an oxide mask. Moreover, a direct further processing can be carried out after the production of the nanostructure due to the low contamination rate and the low crystal defect density without expensive preparatory and/or finishing processes being used.

In a further embodiment a protective layer is formed for the nanostructure with a substantially plane surface. For this purpose, suitable deposition processes can be used which may make an extremely non-conformal deposition of material possible such as the spin-on of materials with a low viscosity. Other processes include the application of a suitable material with a suitable deposition technique with subsequent leveling removing excessive material by means of CMP (chemical mechanical polishing).

In a further embodiment a spin-on glass (SOG) which is adapted in its properties to the requirements to be met by the nanostructure to be passivated is applied in several steps and annealed (completely or partly cured) after each application until a plane surface is formed. Thus, efficient, non-conformal deposition processes for the application of material with a low viscosity can be used, the subsequent curing taking place in a layer-by-layer fashion so that the desired final thickness of the cured material can be precisely adjusted. SOG layers of hydrogen silses quioxane (HSQ) may be applied.

In a further embodiment an additional layer is applied prior to the plasma etching process which, as a buffer layer, has an etching behavior that is changed with respect to the silicon base layer, the etching parameters being the same, in such a way that a self-organized structure with a relatively small aspect ratio is formed. The thickness of the buffer layer is reduced in the course of the process so that it becomes thinner.

Thus, a contribution is made to a reduction of the silicon consumption during the production of self-organized nanostructures in the field of the window openings of integrated circuits with optoelectronic components and of discrete optoelectronic components. The structure formation still takes place quite slowly especially at the beginning of the etching process; however, during this period of time silicon is removed. Then the formation of the needles with a correspondingly high aspect ratio is accelerated. The loss of material during this first etching phase may have detrimental effects if e.g. doped areas are concerned, in which the doping decreases from the surface with a gradient. This removal of material should be as little as possible for a negligibly small influencing of component data. Thus, a removal of the silicon material can be initially prevented by providing the buffer layer, it being, however, possible that a certain masking nanostructure is formed in the buffer layer which then increasingly results in a locally different etching behavior in the silicon, maintaining a desired non-uniformity, the undesired initial loss of material in the silicon remaining small.

The removal of a doped surface layer of the area in the window of an optically active component by means of etching is reduced and, moreover, the aspect ratio can be varied in a simple fashion. Due to the application of an additional layer of defined thickness with an etching behavior other than that of the silicon the removal by means of etching can be reduced. Since the generation of a structure during the etching step is based on the plasma and, thus, a physical component of the etching step is responsible for the generation, it also acts in other materials such as e.g. $SiO_2$. Since the plasma-generated structures are of a very small height in the $SiO_2$, substantially no nanostructures with a high aspect ratio are formed in it. There is substantially no self-masking effect by another chemical component. Thus, the oxide layer is removed in an approximately uniform fashion, however, it receives a plasma-generated nanostructure of a very low height on the surface. The etching rate for $SiO_2$ is a lot lower in the said RIE etching process than that for silicon. Shortly before the $SiO_2$ layer has been completely or partly removed, a rapid or immediate formation of the high aspect ratios in the silicon takes place due to this nanostructure having become full of holes and due to the different etching rate. At the locations of the smallest thicknesses the oxide layer is first of all removed; there the etching process starts with a much higher etching rate and forms a hole in the silicon.

If needed, the entire oxide layer is removed after some time, however, a nanostructure with a considerable aspect ratio has then already been formed in the silicon, the tips of the nanostructures being still almost at the level of the former boundary surface of $SiO_2/Si$.

The process time of the etching step and the thickness and type of the buffer layer may be adapted to each other in an optimum fashion. The etching step can last exactly as long as the complete removal of the buffer layer lasts. However, it does not last longer, since, otherwise, more material than required is removed.

Due to the type of the buffer layer material and due to the thickness of the buffer layer the self-organized nanostructure can be influenced as regards its aspect ratio and its position at a distance below the starting surface, since the generation of the structure by the plasma depends on the material used and, depending upon the etching rate, the buffer layer serves as an additional etching mask more or less long.

In an embodiment the aspect ratio of the structural elements of the nanostructure is adjusted by means of the thickness of the buffer layer. Thus, the optical properties of the nanostructure can be adjusted to a very efficient degree by a very precisely adjustable process parameter, i.e. the layer thickness of the buffer layer, so that a higher degree of flexibility can be achieved in the selection of the etching parameters.

In a further embodiment the buffer layer is a $SiO_2$ layer which has a thickness of 20 nm to 100 nm in one embodiment. Other materials can be used in other embodiments, which bring about a delay of the removal of material in the actual silicon base layer. If a high degree of compatibility of the buffer layer and the silicon base layer is desired, an additional silicon layer may be applied onto the base layer and serve as a buffer layer. Other materials such as SiN can also be used.

In an embodiment the buffer layer is not completely removed so that the resultant structural elements may comprise material of the buffer layer at their tip which may result in an improved resistance of the structural elements. The buffer layer is substantially removed in other cases so that structural silicon elements remain whose height substantially corresponds to the initial height of the silicon base layer.

According to a further aspect of the invention a process for protecting a layer having needle-type structural elements with a high aspect ratio and being a component of a chemical sensor is made available, wherein a gas-permeable porous spin-on glass which is adapted to the requirements to be met by the layer to be passivated in its properties is applied in several steps and tempered after each application until a smooth surface is formed.

Thus, the nanostructure can also be efficiently used in sensor applications since, on the one hand, a high protective effect is achieved and, on the other hand, the contact with gases is still possible.

In an embodiment a covering with a non-porous layer is carried out in a last step, which is again removed during the last masking process.

A pronounced protection is achieved in this fashion during the finishing of the nanostructure, which, thus, ensures a high degree of flexibility in the production process, it being possible to remove the non-porous cover layer without great expenditure prior to the last masking and thus the structuring.

In a further embodiment the spin-on glass is permeable to fluids so that a broad field of applications of the sensor element results.

According to a further aspect of the invention a process for the passivation of the surface of a semiconductor component comprising silicon is made available. The process comprises the local exposing of an area of the surface, the formation of primary needle-type structures with high aspect ratios in nanodimensions with lateral dimensions in the range below the light wavelengths of visible light by means of a reactive ion etching process and the modification of the area provided with the primary needle-type structures in order to produce secondary structures that are also of a needle type.

Due to the modification of the needle-type structures after their production on the basis of silicon efficient, self-organized plasma etching processes such as those described above can be used, the desired material properties of the needle-type structures then being adjusted by the modification process. Thus, a plurality of different nanostructures can still be produced by means of an etching recipe. Thus, the needle-type structures can be provided with an insulating surface in one variant.

In one embodiment a silicon layer is deposited in order to make the surface available. In this fashion an optional support material can be used without substantially influencing the actual process of the structuring, it being then possible to still further adapt the desired material properties by the modification.

In one embodiment the modification of the area provided with the primary needle-type structures comprises a thermal oxidation.

In a further embodiment the modification of the area comprises the nitration of the area. Doping agents and/or other types of semiconductors such as germanium and the like may be applied in other cases.

In one embodiment the silicon in the primary needle-type structures is substantially completely converted to silicon dioxide.

In a further embodiment the primary needle-type structures are produced by means of reactive ion etching (RIE) using the working gases oxygen and $SF_6$ in a single process step without the use of additional means for the targeted mask formation during the structuring process by adjusting the process parameters such that the oxygen in the reaction point on the surface containing silicon shows a self-masking effect and a self-organization of the needle-type structures takes place. Thus, the primary structures can be formed by an extremely efficient etching process, which, then, can be subjected to the desired modification without great expenditure due to the lack of defects and the low surface contamination.

A further invention relates to the production of an optical interface which serves for reducing radiation losses at transitions between the process wafer and the adjoining media for integrated optical applications, in particular in the case of multi-layer metallizations of circuits of integrated optics.

The optically effective material transitions in integrated optical circuits from the process wafer to the adjoining medium with more or less high radiation losses are characterized by reflection in conventional processes, the adaptation being mostly effected by means of the $\lambda/4$ method in the case of adjoining layers of different media, i.e. adjoining layers may be adjusted to the respective wavelength of the radiated and/or received light or an adapted intermediate layer may be inserted. This uses a specific layer thickness production adapted to the respective wavelength and/or wavelength range, which is connected with technological expenditure. However, in this method, as well, specific radiation losses cannot be avoided.

A broadband procedure which is connected with less radiation losses for the radiation transition from the process wafer to an adjoining, optically different layer or several layers and/or in a reverse radiation direction is included in the production technology by using nanostructures that are produced by means of an etching process as it was described above and will be described in the following. Here, nanostructural elements with a height range of from approx. 200 to 1500 nm can be used, it being possible to adapt the respective height to the further production conditions and/or the component conditions. A short process time may be an important aspect in the production of specific products and a smaller elevation of the structural elements nevertheless provides for a moderately high efficiency. According to other aspects a better efficiency may be necessary in the case of longer wavelengths allowing a trend towards the use of a higher average height.

The layer of nanostructural elements can be within narrow height ranges of their structural elements such as in the ranges above 300 nm and below 400 nm or in the range of from 300 nm to 350 nm, this being in each case the average of the individual heights.

Thus, it is possible to use various thicknesses of the optically different layer and/or layers, which adjoin(s) the process wafer, without changing the optical properties of the system for a broad wavelength range. The advantage of a wavelength-independent adaptation of the transition results in the case of an optional layer thickness of the adjoining medium and/or in the case of the use of several different media as the intermediate medium.

The suggested process makes it possible to work with a defined interface between the photocomponent and the environment in the following processing steps, which remains the same even for the most different technological boundary conditions and has very good optical properties such as independence of the wavelength and the lowest optical losses (reflection and absorption). Thus, costs and time can be saved, since the optical system need not be newly conceived for every new integrated optics and a simple change of the semiconductor technology, e.g. to smaller structure sizes, is possible for existing systems. Moreover, the suggested process makes a system integration possible which, so far, has hardly been achievable or not achievable at all with former methods. A plurality of optical elements can be directly integrated on the wafer. Beam dividers, polarisators, optical filters, diffraction gratings, waveguides, prisms, lenses, glass fibers, protecting glasses, liquid crystals, diaphragms, photonic crystals, dielectric layers, absorbing layers, LEDs, LASER, attenuators, modulators, fluorescent substances, conductive electrode materials and optional combinations thereof can be directly integrated on the wafer without any problems.

BRIEF DESCRIPTION OF THE DRAWINGS

Further embodiments are described in the following with reference to the accompanying drawings, in which FIG. 1a shows a section through an electron-microscopical photograph (SEM) with an RIE etched silicon surface in an area which is partly covered by an oxide layer;

FIG. 1b shows an electron-microscopical photograph (SEM) with an obliquely incident electron beam, which reveals the homogeneity of the distribution of the silicon needles and the depth of the interspaces between the needles;

FIG. 1c shows an electron-microscopical photograph (TEM) of the tip of a silicon needle with transmission radiation with a high resolution;

FIG. 1d is FIG. 1c in a vertically aligned fashion;

FIG. 1h shows an electron-microscopical photograph (SEM) in which the height and the lateral dimension of the needles in the base area are indicated by way of example, in which two tips end and the aspect ratio is higher than 4;

FIG. 1i shows an electron-microscopical photograph (SEM), wherein the height and the lateral distances at the base area of the structures are shown by way of example;

FIG. 2a shows a schematic sectional view of a conventional photodiode antireflection;

FIG. 2b shows a schematic sectional view of an anti-reflected photodiode as an example of the invention;

FIG. 3a shows the schematic representation of a vertical section through a photodiode without a protective layer on the nanostructure;

FIG. 3b shows the schematic representation of a vertical section through a photodiode with a protective layer on the nanostructure;

FIG. 4a shows a sequence of steps of the RIE etching of the Si surface without buffer layer with an increased silicon consumption;

FIG. 4b shows a sequence of steps of the RIE etching of the Si surface with buffer layer with a minimum silicon consumption;

FIG. 5 shows a sequence of a modification of a silicon nanostructure to an $SiO_2$ structure according to an embodiment;

FIG. 9a,

FIG. 9b shows two pictures with measuring lines from FIGS. 1a, 1b for their explanation.

DETAILED DESCRIPTION OF PREFERRED EMBODIMENTS

Figure 1E:
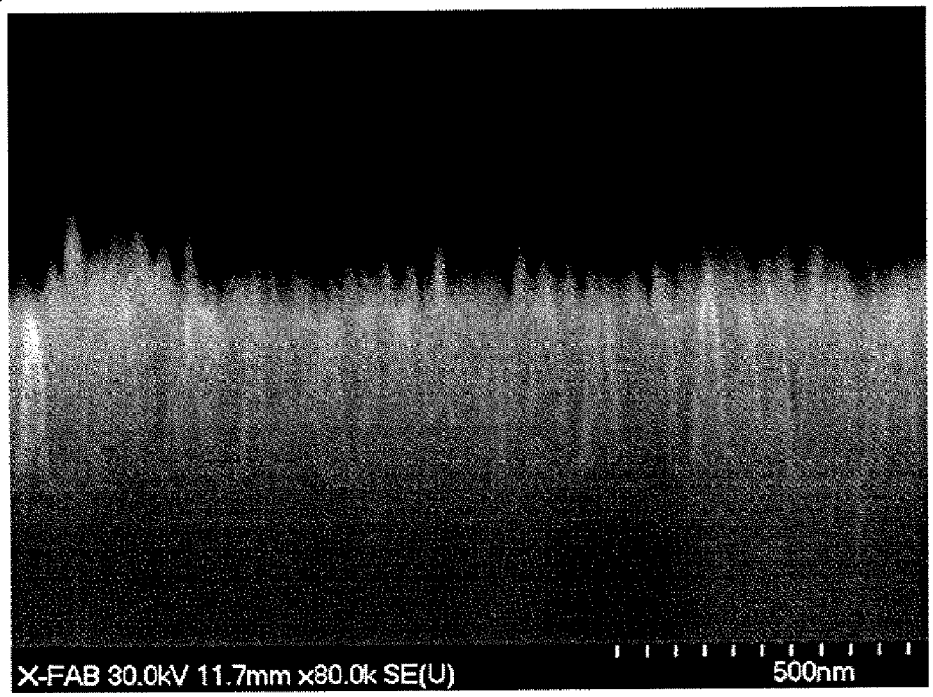
FIG. 1e shows an electron-microscopical photograph (SEM) of the nanostructure with an average height of less than 400 nm.

With reference to FIGS. 1a to 1j and 9a, 9b example-like nanostructures and illustrative processes for their production are first of all elucidated. Then, similar processes and nanostructures can also be used in other applications, e.g. photoelectric components, sensor components, as optical coating structures in optical devices, as optical windows and the like, as this was already set forth above and will also be described in the following embodiments. Moreover, the nanostructures as they are e.g. produced by means of the processes described in the following may also be subjected to further treatments for the application of protective layers, the modification of the surface and the like.

FIG. 1a shows a silicon-containing component 1 with a nanostructure 2 which has a monocrystalline silicon base layer 3 on which needle-type silicon structures 4 which are also alternatively (however as a synonym) designated as structural elements of the nanostructure 2 in this application, are formed. Needle-type silicon structures may be understood as "needles" or structural elements in this application, which have a tip with lateral dimensions of a few nanometers, the tip clearly increasing in its lateral dimension towards below so that a relatively large lateral dimension is achieved in the lower area of the structures with a relatively shallow ending (with respect to the slope of side walls of the central area), wherein even two or more tips may end in a single base area which is then clearly broader than the individual tips.

In this embodiment the silicon base layer 3 is limited by a mask layer 5 which may be built up from silicon dioxide, silicon nitride or the like, the needle-type silicon structures 4 being formed up to a marginal area 5a of the mask layer 5 with a small distance to the marginal area 5a. Here, a small distance may be understood as a stretch which is smaller than half the thickness of the mask layer 5. In the shown embodiment the silicon base layer 3 is part of a silicon wafer with a diameter of 6 inches with a (100) surface orientation, which has a p doping which results in a resistivity of 10 ohm*cm.

As already stated above the base layer 3 may, however, have an optional crystal orientation with an optional predoping. The base layer 3 may be substantially formed from amorphous or polycrystalline silicon in alternative examples.

FIG. 1b shows an enlarged part of the nanostructure 2, wherein the angle of incidence of the probing electron beam has an angle of inclination of about 17° in order to show the size ratios in the lateral direction and in the height and/or thickness direction of the structures and/or structural elements 4 more clearly. As can be seen from FIGS. 1a and 1b the silicon structures 4 have a height in these embodiments, which is on average about 400 nm to 850 nm so that in some embodiments a height is achieved which is higher than the wavelengths of the visible light. In other embodiments the height of the structural elements in a respective layer or on a respective plane section of a larger layer surface is on average between 400 nm and 1500 nm. i.e. a layer with structures at 400 nm on average or other layers with average heights of 500 nm or 600 nm or up to 1500 nm, in each case as a layer height of its own. Thus, these structures can be used i.e. in connection with an integration in a metallization structure in the form of an optical "interface" in a very advantageous manner as this will be described in greater detail in the following.

Due to the tilted electron beam of 17° the height plotted as the measure in FIG. 1b of 603 nm may be recalculated to the real height. The height extension can be newly calculated by up to 60% (from the real height) for lower needles which, in these embodiments, are designed to about 400 nm in order to achieve their desired effects. This is done by means of the upsetting of FIG. 1a in the height direction to 40% of the represented height.

The height of the needles in FIG. 1b are the same as those of FIG. 1a. The same sample is shown in the pictures, cf. FIGS. 9a, 9b. The pictures were made one after the other. The difference of the indications of measurement cannot be explained with the tilting angle of 17°. It is shown once again how difficult it is to make concrete indications in these size ranges. The cause of the optical effect is presumably that the measurement was carried out at the lowest point and at the highest visible point for FIG. 1a, whereas, for FIG. 1b, the locally lowest point and the highest visible breaking point was used. However, the needles somewhat higher than this dimensioning makes believe. If one has a critical look at FIG. 1a and assumes the highest break line as the highest point, the value of the needle height is also reduced. FIGS. 9a, 9b illustrate this in a direct comparison.

However, pyramid-like structures 4 with an average height in the range of 400 nm also show excellent optical properties in many applications. It was e.g. possible to observe an excellent anti-reflection for an average height of 400 nm in the wavelength range of more than 180 nm, which was measured so far, up to the 3000 nm presently measured. An average height of the nanostructures of less than 400 nm is used in further embodiments as this will be described in the following.

As can be seen from FIG. 1a a height of the silicon structures 4 may also be substantially at 1000 nm.

On the other hand, FIGS. 1a and 1b show that the lateral dimension of the silicon structures 4 in a base area 4b at the lower end of one of the nanostructures is typically less than 100 nm so that, on average, an aspect ratio of height to lateral dimension of at least 4, mostly even more, is achieved.

The results represented in FIGS. 1a and 1b which relate to a 6-inch (100) Si wafer with p doping, a resistance of 10 ohm*cm and a surface share of the oxide mask, i.e. the mask layer 5, of 90% (up to substantially 93%) were produced in a single-step plasma etching process in a facility of the STS320 type with the following parameters:

| | |
|---|---|
| SF$_6$ gas flow: | 100 sccm |
| O$_2$ gas flow: | 20 sccm |
| Gas pressure: | 70 mtorr |
| Temperature of the Si wafer: | 27° C. |
| Plasma power: | 100 W |
| Etching time: | 2 min |
| Self-adjusting BIAS (d-c voltage potential between the plasma atmosphere and the surface to be etched surface): | varies by 350 V. |

The 6" (inch) wafer rested on an 8" wafer in the RIE STS 320 facility in this example, so that the plasma can also act alongside the 6" wafer and the carrier wafer, if needed, can serve as a silicon source during the etching process.

The indication of a power density is possible in a first approximation in an assessment. The plasma power can be adjusted in the range of from 100 W to 300 W, which corresponds to a power density of approx. 4 W/cm$^2$ to 12 W/cm$^2$ for a 6 inch wafer.

Gas flow rates of 50 to 150 sccm for the reactive gas, i.e. SF$_6$, were provided in other embodiments. Gas flow rates of 20 to 200 sccm are provided for oxygen. Moreover, the temperature of the substrate and thus of the base layer 3 is adjusted to 27° C.±5° C. to in a few embodiments. Other examples only worked with an 8-inch wafer without an underlying supporting wafer. Comparable results are obtained.

Comparable results for the nanostructured surface were achieved in alternative examples. Starting parameters and process parameters are indicated below.

For a surface share of 0.1% silicon and 99.9% oxide mask with the following parameters:
150 sccm SF$_6$
20 sccm O$_2$
91 mtorr
27° C.
100 watts
4 minutes etching time (process time)
Bias 310 V/28 V For a 100% silicon surface, i.e. a blank silicon wafer
65 sccm SF$_6$
23 sccm O$_2$
50 mtorr
27° C.
100 watts
10 min. to 20 min. etching time (process time)
Bias 440 V/125 V A process time of up to 20 min. is also practical for blank silicon wafers. Then, an extremely high-quality anti-reflection of the surface nanostructured with the needles is obtained with the process. Here, the oxygen gas flow should preferably be increased by 10% to 20%.

The bias values of the aforementioned examples are "tip-to-tip" for the respectively first value and the "chamber bias voltage" for the respectively second value of an example.

Corresponding parameter values for other etching facilities and other degrees of covering of the silicon base layer 3 to be structured with the needle-type structures can be ascertained from the aforementioned indications. A lesser degree of covering of the silicon base layer can e.g. be taken into account by a lower gas flow rate of the reactive gas.

The absolute parameter values can be efficiently adapted to the share of the open (or free) silicon surface in further examples. If a high surface portion of the Si surface is covered by the mask layer, e.g. oxide or silicon nitride, this can at least be compensated by an increase in the reactive gas share, e.g. in the SF$_6$ share, in particular also in the case of an increase in the SF$_6$ share with a simultaneous decrease in the oxygen share and a simultaneous increase in the process pressure.

If there is no mask, the share of the reactive gas is low and vice versa.

With the aforementioned adjustments the Si needles and/or structural elements 4 with a height of up to approx. 1000 nm in statistical distribution resulted in general at the areas that were not masked by the mask layer 5. In other examples of embodiments needle structures with an average height of less than 400 nm, in particular of from 300 nm to less than 400 nm, moreover, in particular in the range of from 300 nm to 350 nm, were produced on the basis of the aforementioned process parameters and conditions.

Silicon oxides or silicon nitrides are suitable as mask layer 5.

Processed wafers with similar structures (without oxide mask) were completely black and showed a reflection of less 0.4% for the wavelength range of from 400 nm to 1000 nm with a simultaneously excellent homogeneity of this property across the entire wafer. In particular in a wavelength range of from 180 nm to 3000 nm wavelength, which extends beyond this in both directions, examinations showed a still excellent anti-reflection behavior with reflections of less than 2%. Here, the reflections (practically) covered the reflections in all solid angles.

Moreover, the crystal damage caused by the plasma-aided one-step structuring process and the contamination are very low and are below the detection limit in the shown examples of embodiment. It was not possible to detect any residual substances after the plasma structuring process and the crystal quality of the silicon structures is almost identical to the crystal quality of the crystal base layer prior to the etching process.

FIG. 1c shows a representation of a single tip 4a and/or an end area of a structure element 4. As can be clearly recognized the needles are almost atomically pointed at their end area 4a, i.e. the lateral dimensions of the end area 4a are a few nanometers and, thus, are smaller than 10 nanometers. Moreover, in the representation of FIGS. 1c and 1d the crystal direction is plotted vertically to the surface of the silicon base layer 3. This direction corresponds to a [100] direction, since, for the shown example of embodiment, the surface orientation is a (100) orientation. As can be recognized the end area substantially extends along the [100] direction with a slight deviation from less than 10° so that the structural elements are aligned almost vertically with a deviation of a few degrees to the surface of the base layer 3. Moreover, individual lattice planes of the monocrystalline needle can be clearly recognized without crystal defects being caused by etching being recognizable. In the shown configuration of the base layer the appearing lattice planes correspond to (111) planes.

FIG. 1e shows an electron microscopical photograph of a detail of the structure 2, it being also clear that the individual structural elements 4a have a relatively well definable average height across a larger range, which is smaller than 400 nm in this example of embodiment.

Figure 1F:
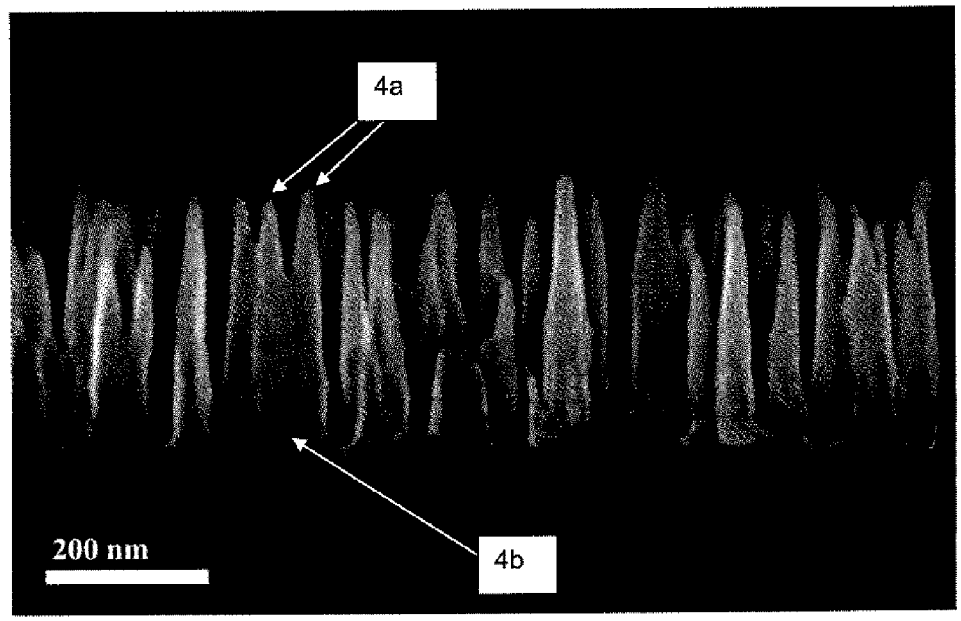
FIG. 1f shows an electron-microscopical photograph (SEM) with a higher resolution.

FIG. 1f shows a part of the photograph of FIG. 1e in a greatly enlarged fashion, individual structural elements 4 being also recognizable, which have two tips 4a which end in a common base area 4b, an aspect ratio of higher than 4 being nevertheless achieved.

Figure 1G:
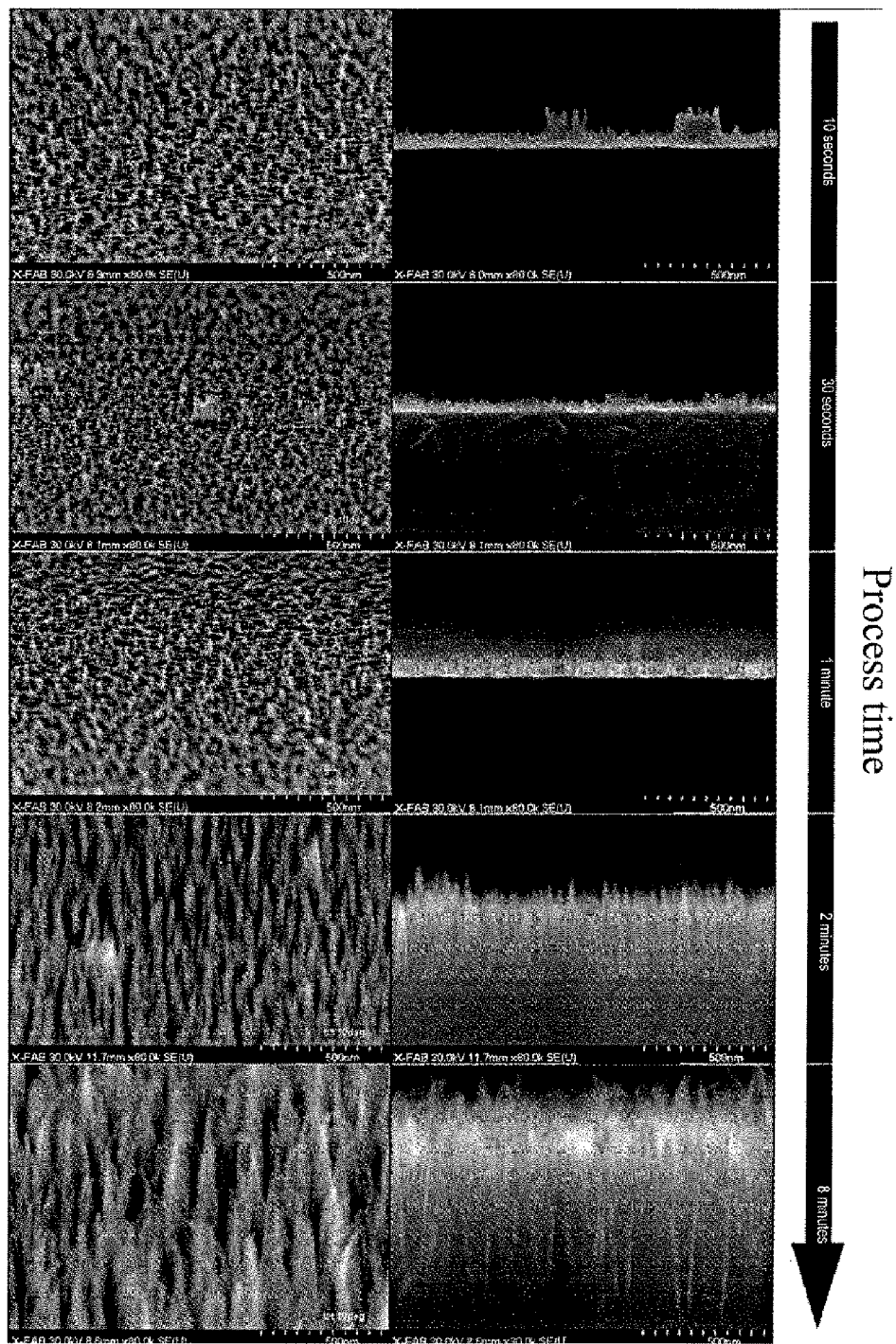
FIG. 1g shows a time sequence of electron-microscopical photographs (SEM) which show clearly that a self-masking effect is already effective after a short period of time (10 seconds)

FIG. 1g shows a sequence of photographs which represent different phases of the etching process. As can in particular be seen in the greatly enlarged photographs on the right-hand side a pronounced self-masking effect already results during the initial phase of the etching so that, during the further course, the already present "structures" are then efficiently further driven into the silicon. Thus, an excessive silicon consumption is avoided during the further etching process, it being possible to still further restrict it as this will be described in greater detail.

FIG. 1h shows the structure 2 in the embodiment in which the height of the individual structural elements is smaller than 400 nm. There, a typical height of 340 nm is indicated, the thickness of the base area 4b for an element with double tip is 80 nm so that a corresponding aspect ratio is higher than 4. The aspect ratio is still clearly higher for structural elements without double tip. On average, the aspect ratio is thus higher than 4, even if isolated structural elements 4 have a smaller aspect ratio. Corresponding indications on the aspect ratio are to designate a representative average value.

FIG. 1i shows typical lateral distances for one embodiment with an average height of less than 400 nm. The lateral distances are in the range of from about 20 nm to 150 nm so that an average distance which is clearly below the wavelength of the visible light is achieved, wherewith the anti-reflection behavior is in particular improved at shorter wavelengths.

Figure 1J:
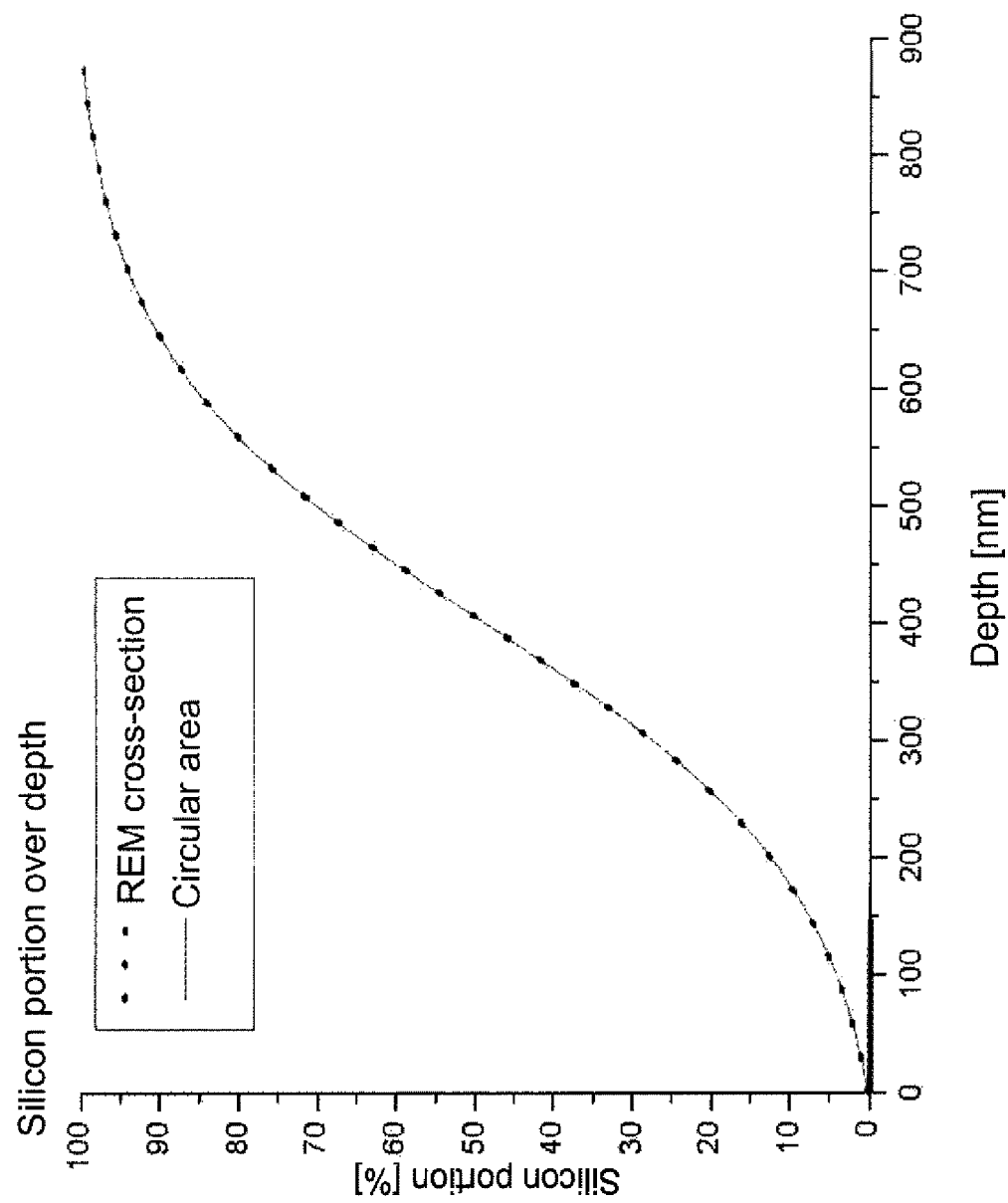
FIG. 1j shows a transition function (a volume distribution of silicon across the depth of the nanostructure), which illustrates the gradual transition from silicon to an adjoining medium, e.g. SOG or air.
Figure 1K:
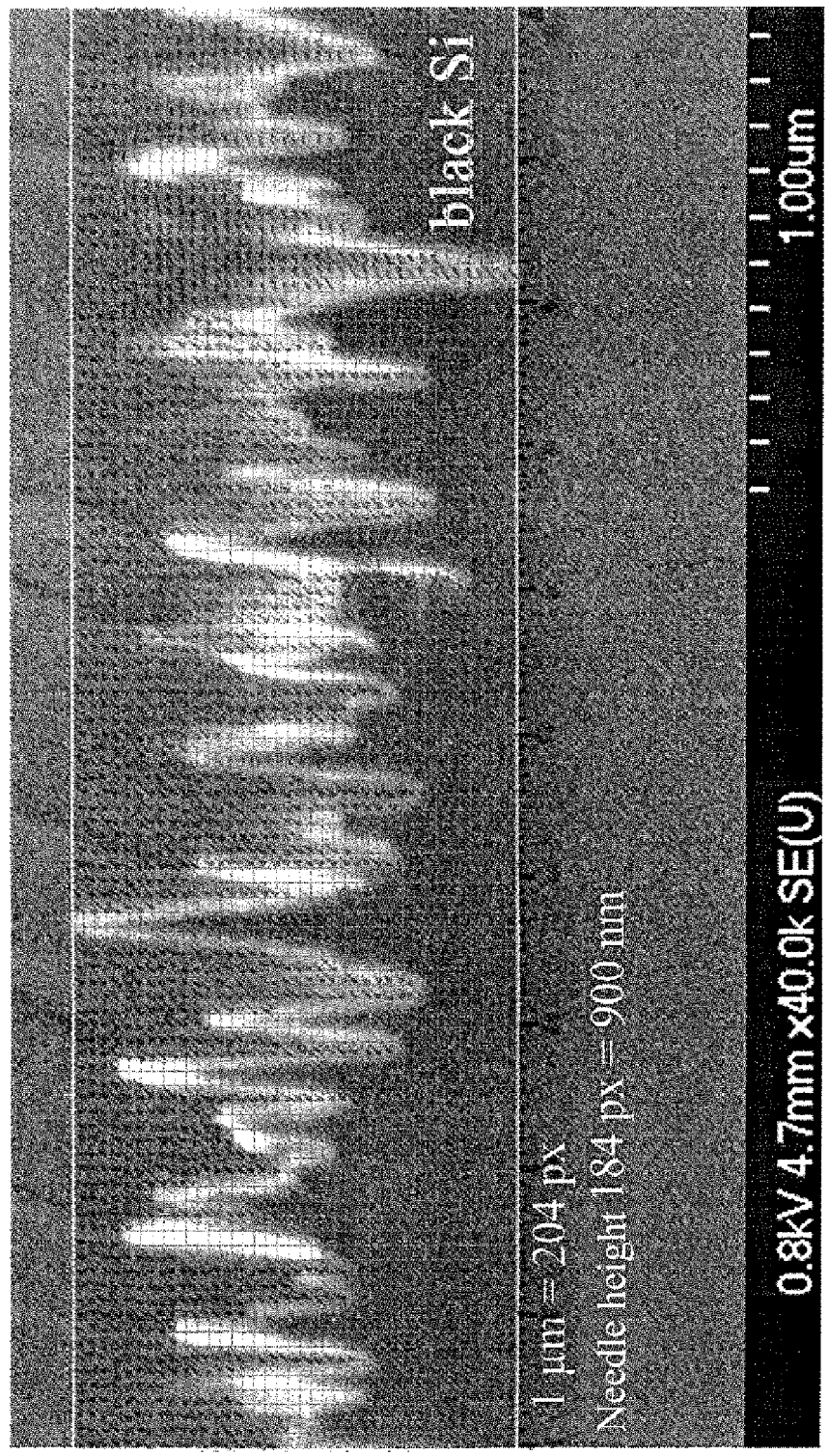
FIG. 1k shows a nanostructure, on which the counting (for obtaining the transition function according to FIG. 1) was based.

FIG. 1j shows a transfer function which indicates the silicon share as a function of the height and/or depth of the structure 2, a structure with an average height and/or depth of 900 nm being used in this example. The transfer function was ascertained by means of a good REM picture of a breaking line by dividing the picture into uniform boxes and either silicon or air being allocated to each box, cf. in this connection FIG. 1k which illustrates this. The results ascertained in this fashion were subjected to various functions, the Boltzmann function resulting in a very good adaptation.

The curve ascertained in this fashion with the corresponding measuring values (dotted in black) can be seen in FIG. 1j. Since a break represents one of two dimensions, it was attempted to extend the whole thing to three dimensions. Here, a round needle shape was ascertained in accordance with an optical model as being suitable, since, therewith, it was possible to replicate the measured reflection values.

The curve in FIG. 1j clearly shows the gradual increase in the silicon share upon approaching the base layer 3 and the decrease in the silicon share with increasing height as the "transfer function", this corresponding to a corresponding increase in the share of the surrounding medium. Here, a gentle approach to the respective medium, i.e. pure silicon and SOG in the shown example, is achieved at the respective "end areas" of the curve. Moreover, it can be recognized that an approximately symmetrical shape of the transition curve results, which has an advantageous effect in the case of the use the corresponding silicon structures as a model, in particular as a stamping mold, because the "negative image" formed by this silicon shape during stamping or during the production of the stamping master also results in a suitable transfer function similar to that shown in FIG. 1j.

It should be noted that a similar transition function is also obtained for the structures with an average height of less than 400 nm. The x-axis must be correspondingly upset.

Spin-on glass (SOG) is at the top in the example and silicon is at the bottom in the example. If a viewer moves from the lower medium to the upper medium (in each case vertically outside the structural elements), the refractive index of the layer 2 with the nanostructural elements 4 is not changed in a step-wise or jerky fashion, but rather in a gentle course of FIG. 1j in accordance with the change in the volume shares of Si and SOG.

The area of the base layer 3 is considerably increased due to its surface being greatly rugged after the process, due to which the properties are clearly changed. The enlarged surface offers a much larger point of attack for accumulating molecules and, thus, it can e.g. considerably increase the sensitivity of sensors. It was e.g. found that gases remain localized in the nanostructure 2 for quite a period of time.

The needle-type structures 4 are of interest in the optical field since they are smaller than the light wavelength (VIS/NIR) in their lateral size and are an almost perfect gradient layer due to their needle shape, i.e. due to the small lateral dimension of the end area 4a and the relative large dimension at the base 4b of the needle-type structure and the high aspect ratios. The refractive index is changed gradually from the refractive index of silicon to the refractive index of the medium surrounding the nanostructure 2, e.g. air.

Thus, the nanostructure 2 makes an adaptation of impedance or an adaptation of the refractive index possible which results in an excellent broadband reflection suppression. Moreover, it is known that sharp curvatures as they are possessed by the needle tips 4a are especially suitable for a field emission.

Thus, a broad field for the use of the nanostructure 4 in many micro components and also in other fields such as solar cells, sensors and the like results as this was already described above and will be further described in the following.

Thus, the examples make processes and structures available, in which silicon structures with a high and adjustable aspect ratio occur, and, due to the (special) parameter adjustment in the self-masking plasma etching process in a single etching step a contamination and a formation of plasma-induced crystal defects is kept small so that with little expenditure for the one-step structuring process the resultant structure can be directly further used without further finishing steps being necessary, if needle-type silicon structures in a high monocrystalline form are needed.

Moreover, no expensive surface preparations or additional measures for producing a micromasking are needed. A preconditioning, i.e. a preparation of the surface for obtaining the nanostructures, can be omitted.

A plurality of almost crystal-defect-free, needle-type structures with a high aspect ratio and with nanodimensions is produced on the surface of a silicon wafer or another silicon base layer by means of a RIE standard etching process for silicon without any additional structuring measure (e-beam, interference lithography and others) by means of the self-organization, whereby i.a. a broadband anti-reflection can be achieved.

With reference to FIGS. 2a to 2f applications for the anti-reflection of photoelectronic components by means of self-organized nanostructures and corresponding components are described, wherein the structures described above, e.g. also the processes described above and in particular the structures of FIGS. 1e to 1i with an average height of less than 400 nm can be used.

Here, the anti-reflection of photoelectronic components such as photodiodes as a component of an integrated circuit or also as a discrete component is not carried out in a conventional fashion with $\lambda/4$ layers, but by means of nanostructures produced by means of RIE etching which have a far better broadband characteristic.

Thus, photo-sensitive components in integrated circuits and discrete components such as photocells are examples. The results achieved with conventional means and the difficulties connected therewith were already set forth above.

Processes for the production of an anti-reflection surface for integrated optoelectronic circuits which are compatible with discrete and integrated component technologies, which can be implemented with little expenditure and thus low costs are possible without said disadvantages.

The corresponding processes are i.a. compatible with a bipolar, CMOS or BiCMOS technology for integrated or discrete components. It can be used alternatively or supplementarily to an anti-reflection coating. It is not more expensive than the same, however, it has a wavelength-independent anti-reflection of a good quality across the wavelength range which is of interest for silicon photodiodes. A further advantage of the anti-reflection is its little dependence on the angle of incidence as compared with $\lambda/4$ layers or regular structures.

The property of the freedom from defects of the used areas, which is achieved in the indicated process is of special importance for photodiodes, since the generated electron-hole pairs can otherwise recombine and not be sucked off by the electrical field, which represents a considerable reduction of the sensitivity.

FIG. 2a schematically shows a conventional photoelectric component 200 with a silicon substrate 201, an n-well 202 and corresponding contacts 205. Moreover, an optical window 203 is provided which is anti-reflection-coated with an anti-reflection layer 204.

FIG. 2b shows the photoelectrical component 200 according to an embodiment of the present invention. Here, a nanostructure such as the structure 2 is provided in the area of the optical window 203 in order to achieve a broad-band anti-reflection.

As described above, the self-organized nanostructures, e.g. the structure 2, have a geometrical shape which is adequate for use as an anti-reflection layer. The lateral distances are smaller than the wavelength in the medium so that no scattering losses occur due to this. The nanostructures (FIGS. 1a to 1c) are provided with >400 nm at about 1000 nm. However, a very good anti-reflection can already be observed at average heights of less than 400 nm.

The reduction of the reflection on such a surface can be explained by an impedance adaptation (an adaptation of the refractive index) between the two materials. The structures generate a gradual impedance transition between the materials. This transition may be sufficiently broad (here the height of the structures) in order to act accordingly. The gradual transition functions according to the principle of the effective medium, two substances being mixed with each other in such a way that it appears to be one substance with the mixed properties of the two starting materials for the application. Since the nanostructures have a needle shape in the sense defined above a so-to-speak continuous transition from the one medium to the other one (here from air to silicon) is formed. It is known from electrical engineering, cf. Pozar, Microwave Engineering (2nd edition), John Wiley and Sons, New York, 1998, that at least at one end of the transition a specific non-linear shape is especially effective.

The structures used here have such a shape. They are very pointed, however, on average, are tapered off in a flat fashion as this can also be seen in the transition curve of FIG. 1j, which results in a change in impedance which is at first little, however, at the end in a very great.

FIG. 1c shows corresponding reflection curves for different components 200 with and without the nanostructure 2.

The measured reflection spectra confirm the drastic reduction of the reflection losses.

Figure 2C:
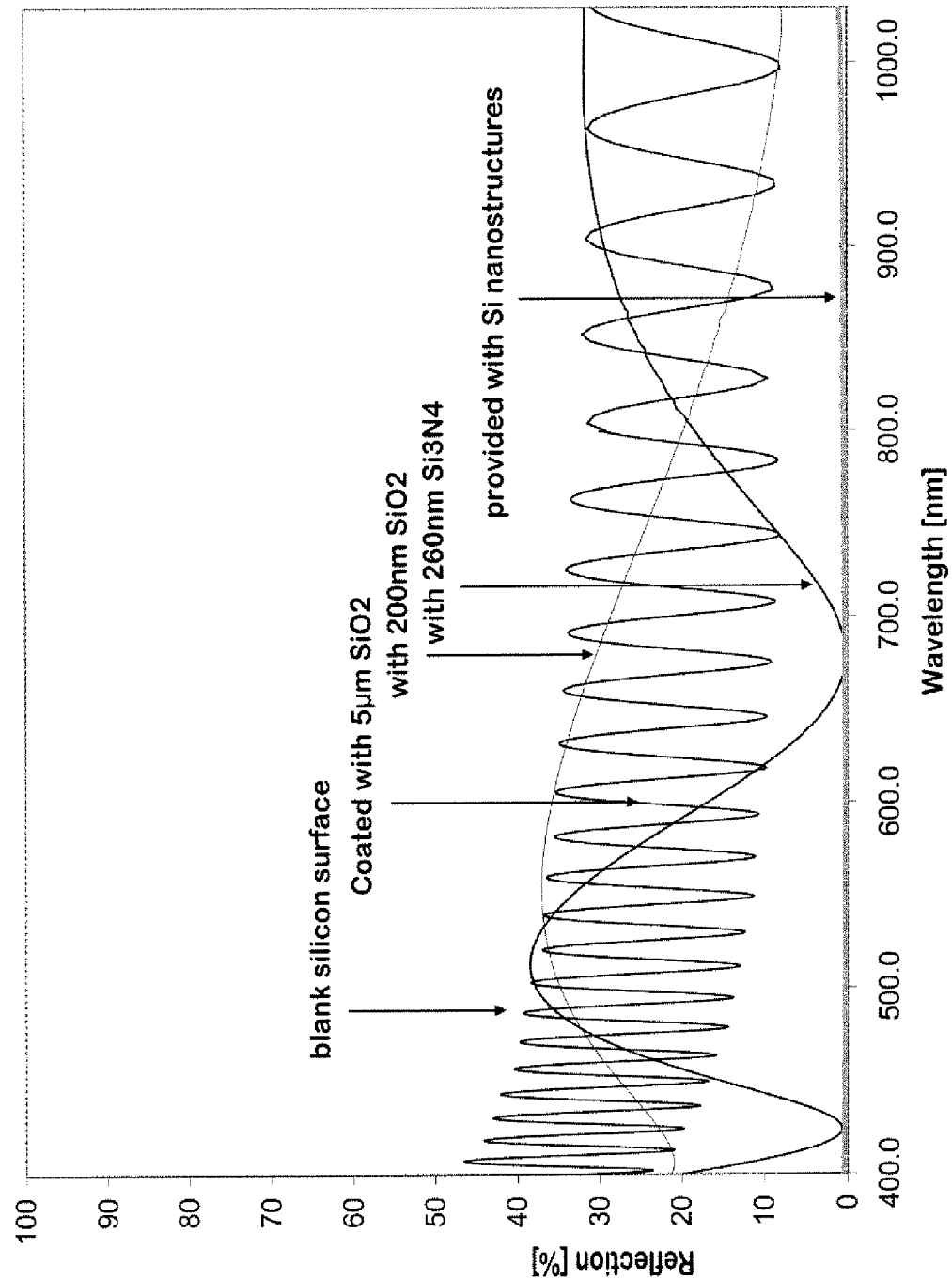
FIG. 2c shows a diagram of the reflections at silicon surfaces that were anti-reflection coated in different ways.
Figure 2D:
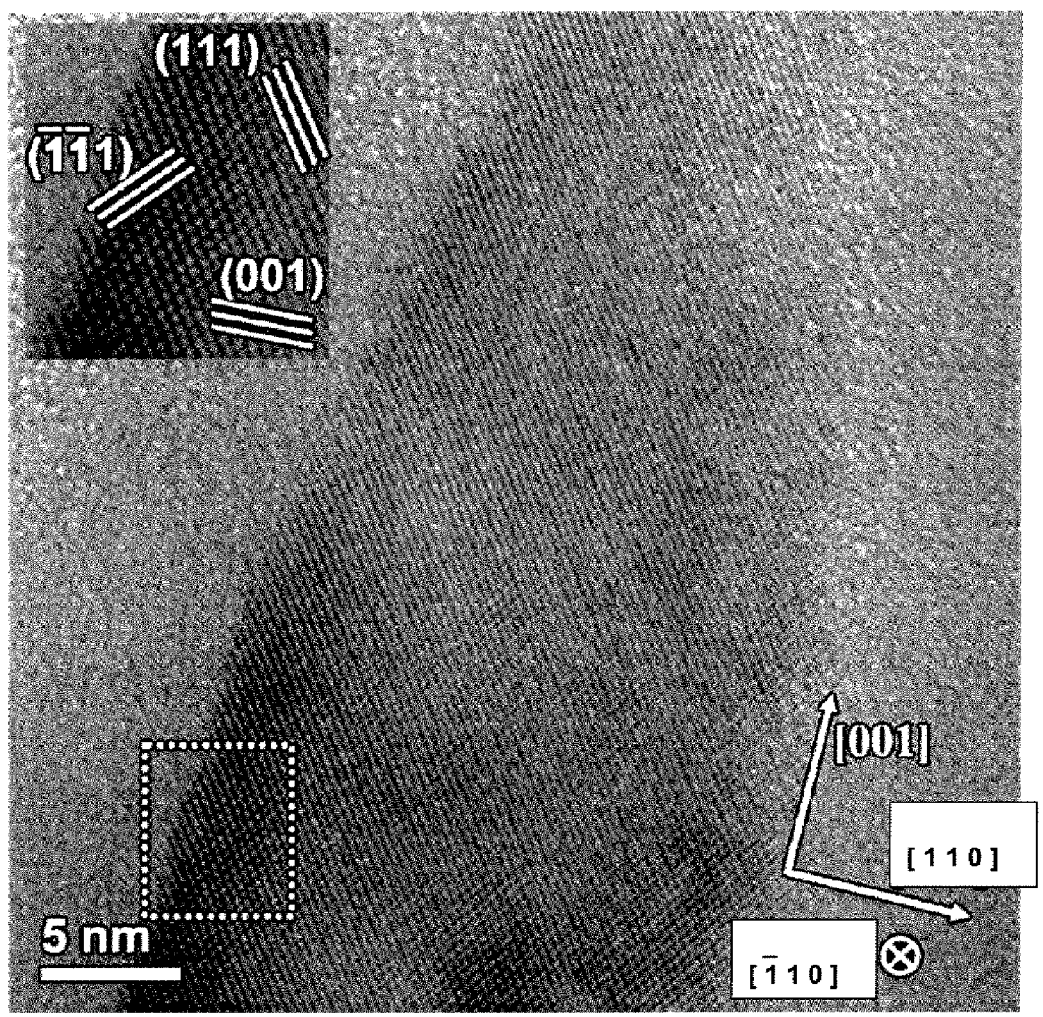
FIG. 2d shows a transmission electron-microscopical photograph of a single silicon tip of the RIE treated surface.

FIG. 2d shows the result of crystallographic examinations which show that the nanostructures 2 remained monocrystalline during the production. Corresponding lattice planes can be recognized in an upper section of a structure element of FIG. 2d as they are also shown in FIG. 1c. No additional crystal defects can be recognized with respect to the base layer 3 and the needle is substantially aligned along the [100] direction. Thus, no additional generation and recombination centers are formed. Thus, the risk of unintended luminous flux losses and/or increased dark currents is sufficiently reduced.

Figure 2E:
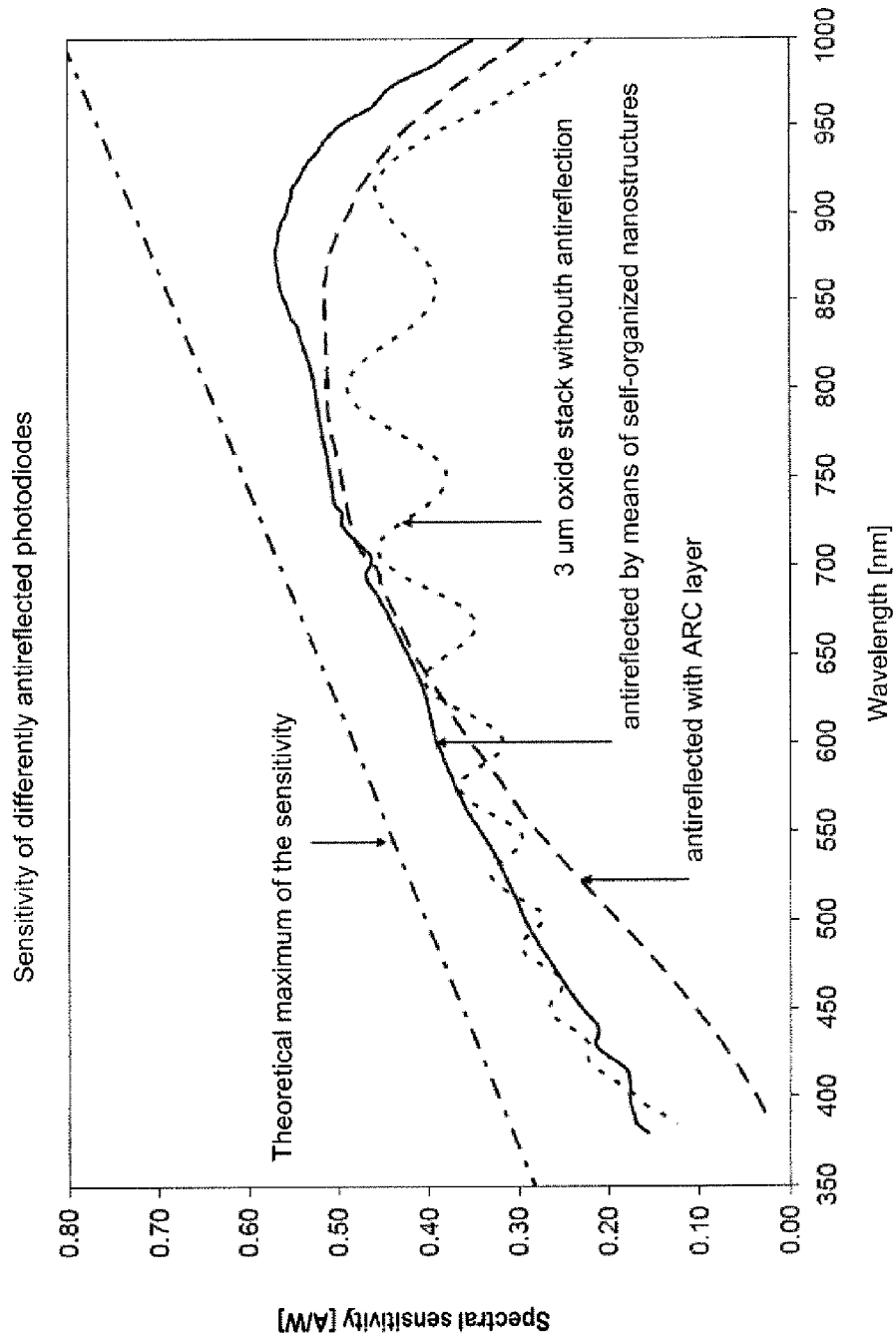
FIG. 2e shows the diagram of the spectral sensitivities of diodes which are built up in the same fashion, but have different passivation layers.

FIG. 2e shows spectral sensitivity measurements at diodes which were provided with an antireflection according to the invention in such a way, which confirm the increased sensitivity in a large wavelength range. In particular the strong oscillations attributable to interferences are not found, which are customary in the normal passivation of integrated photodiodes.

An illustrative example of embodiment relates to a process for the anti-reflection of silicon photodiodes which excels by the fact that crystal-defect-free, needle-type structures in nanometer dimensions with an aspect ratio of 4 to 1 and larger are produced in the surface area of the diode window by means of a reactive ion etching process RIE using the working gases oxygen and $SF_6$ without the use of additional means for the targeted mask formation in a single process step, wherein the silicon wafer is kept at a constant temperature in the range of 27° C.±5° Celsius during the process and it is worked with a plasma power ranging from about 100 to 300 watts, higher plasma powers being necessary at higher process pressures and the ratio of the working gas flows which was empirically determined in advance as a function of the geometrical facility parameters being adjusted in such a way that the oxygen in the reaction point on the silicon wafer has a self-masking effect, which can be achieved in the range of the gas flows for $SF_6$ of from 50 to 150 sccm and for $O_2$ of from 20 to 200 sccm, the process time amounting to a few minutes.

In a further embodiment the component, e.g. the component 200, has a reflection-reducing layer of statistically regularly distributed silicon needles poor in defects with a height of from 400 to 1500 nm and an aspect ratio of more than 4:1 in the optically active window area, such as they are formed by the use of the RIE process according to the aforementioned process.

Now further embodiments of the invention are described with reference to FIGS. 3a to 3c, which indicate processes for the protection of sensitive nanostructures.

Extremely fine structures (nanostructures) are possibly not very robust vis-à-vis mechanical forces. Consequently, it is necessary for a plurality of applications to protect them against a mechanical destruction. This protection is achieved by a filling substance until a smooth surface is achieved. For this purpose a spin-on glass (SOG) with adapted properties can be used.

Protective layers for easily scratchable surfaces have been in existence for a fairly long period of time, be it hard layers for plastic glasses or CDs. There are also efforts to protect nanostructures, cf. EP-A 1 215 513.

A protective layer is to basically prevent the destruction of a function element without impairing its function to a too great extent. Mostly, a series of boundary conditions may also be taken into consideration, due to which the implementation of such a layer is complicated. This applies in particular to the protection of a layer which consists of needle-type silicon tips in nanometer dimensions with a high aspect ratio of about 4:1 and higher—briefly called nanostructure—such as it can e.g. be produced with the RIE process in a crystal-defect-free and self-organizing fashion as this was already described above.

The examples provide a process for the protection of such nanostructures which provides a mechanical protection within the framework of further processing processes of silicon wafers with such layers without substantially changing the special properties of these layers such as reflection, adhesion of chemical substances, etc.

Thus, the advantages are achieved that the protective layer fills the hollow spaces between the needle-type silicon tips to be protected and the structures are thus stabilized. A closed layer is formed for the further processing.

Due to the smooth surface produced in this fashion mechanical strains can be absorbed without destroying the nanostructure. A further layer can be applied onto this smooth surface and also again removed from it in a much simpler fashion.

Depending upon the used material this protective layer interferes in the function of the nanostructure in a different fashion. The surface-enlarging function of a nanostructure is completely or partly prevented by a dense layer. Whereas a porous layer can be used for allowing specific substances to pass to the surface of the nanostructure, which e.g. plays a part in chemical sensors. It is of importance for all optical applications that the properties of the reflection and transmission or also of the scattering are only slightly deteriorated or even improved. For this purpose, the layer preferably has a low absorption. Reflection losses remain at a minimum, if the refractive index is as low as possible.

FIG. 3a schematically shows a photoelectrical component 300 with a silicon substrate 301, an n-well 302 and corresponding contacts 305. Moreover, an optical window 303 is provided which is anti-reflected with a described nanostructure 2.

For the anti-reflecting of the component, e.g. a photodiode, produced by a CMOS process, a nanostructure 2 is e.g. etched into the surface of the silicon with the RIE process in the already described fashion. This process step is customarily followed by further ones. I.e., the bond pads are still freed from the layer passivating the circuit for the contacting 305 of the components 300. In one embodiment, the same consists of $SiO_2$ or $Si_3N_4$ and is mostly applied by means of the CVD process. This process is more or less conformal. Pointed structures are maintained. No smooth surface is formed. Photoresist mask and etching step are used for removing the passivation layer. However, the applied photoresist cannot be removed from the nanostructure 2 without any problems; photoresist residues restrict its functionality.

FIG. 3b shows the component according to an illustrative embodiment.

Consequently, a layer 305 of spin-on glass (SOG) is applied beforehand by means of spinning on, e.g. hydrogen silses quioxane (HSQ), to protect the nanostructure 2. Since this substance is liquid upon application, the interspaces of the nanostructures are filled so that they are free from shrinkage cavities. A tempering step cures this glass, however already results in a certain shrinkage, so that it is advantageous to repeat this procedure. After a few such steps the nanostructures is completely or partly enveloped and the surface is plane and resistant against mechanical damage.

The nanostructure protected in this fashion can now be further processed with the standard processes of CMOS technology without any problems. The application of a photoresist layer and its removal is no problem. The optical function of the nanostructure 2 is only slightly deteriorated due to the low refractive index of 1.38 and the low absorption in the wavelength range of more than 180 nm to 1100 nm.

Figure 3C:
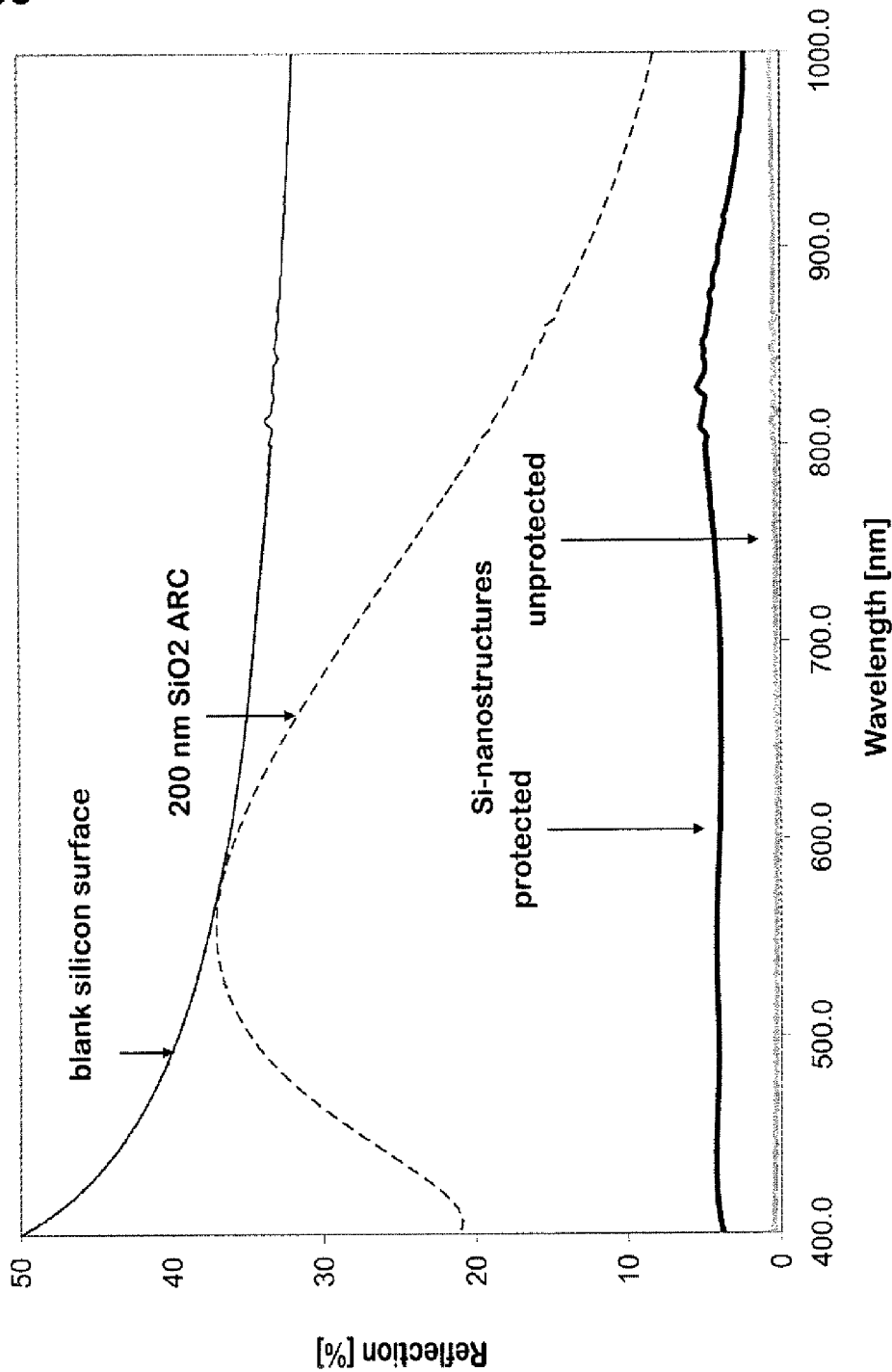
FIG. 3c shows a diagram with the values of the reflection prior to and after the application of the protective SOG layer on a silicon nanostructure.

FIG. 3c shows corresponding measuring results for the reflection of the optical window 303 for situations with an ARC (anti-reflecting) layer with blank silicon in each case without the structure 2 and for the components 300 according to FIGS. 3a and 3b. This is a broadband antireflection which is clearly better with a reflection of 3.5% than the smooth blank silicon boundary layer with >30%.

One embodiment relates to a process for protecting a layer which consists of needle-type silicon tips with a high aspect ratio of about 4:1 and higher with nanometer dimensions, wherein a spin-on glass which is adapted to the requirements to the layer to be passivated is applied in several steps and is tempered after each application until a smooth surface is formed.

In a further embodiment SOG layers of hydrogen silsesquioxane (HSQ) are applied for layers of needle-type silicon tips, which are present in windows of photoelectrical components.

A further embodiment relates to a process for protecting a layer consisting of needle-type silicon tips with a high aspect ratio and is a component of a chemical sensor, wherein a gas-permeable, porous spin-on glass whose properties are adapted to the requirements to the layer to be passivated is applied in several steps and is tempered after each application until a smooth surface is formed and in a last step a covering with a non-porous layer is carried out, which is again removed during the last masking process.

A further embodiment relates to a process for protecting a layer which consists of needle-type silicon tips with a high aspect ratio and is a component of a chemical sensor, wherein a fluid-permeable, porous spin-on glass whose properties are adapted to the requirements to the layer to be passivated is applied in several steps and is tempered after each application until a smooth surface is formed and, in a last step, a covering with a non-porous layer is carried out, which is again removed during the last masking process.

With reference to FIGS. 4a and 4b further embodiments are described in which the removal of material is reduced during the formation of a nanostructure with needle-type tips and a high aspect ratio and thus the production tolerances and the yield are improved.

The "needle-type nanometer structures" (briefly called nanostructures) which are produced in a self-organized fashion by means of the RIE process (reactive ion etching) described above, as they have already been described above, need a specific period of time until their complete formation. Since the self-masking is certainly effective from the start, but still not that pronounced (cf. FIG. 1g) a removal of material takes place, which cannot be tolerated in some applications. This effect can be reduced or completely avoided by an adapted buffer layer.

Due to this, the advantages are achieved that the removal by means of etching of the doped surface layers of the area in the window of the optically active components or of sensor elements is reduced and, moreover, the aspect ratio can be easily varied.

FIG. 4a shows a typical process sequence in individual intermediate steps for the production of a previously described nanostructure 2 with an average height of less than 400 nm, wherein beginning with a plane silicon surface 411a on a silicon body 401 the nanostructure 2 is formed in a non-masked area 403 of the silicon surface 401a with increasing duration of etching, a material layer 405 of the initial silicon volume 401 being finally "consumed".

FIG. 4b schematically shows the production of the nanostructure 2 by means of a buffer layer 406 which has a lower etching rate as compared with the silicon 401. Thus, at first a clearly less pronounced structuring 406a is created which is then driven into the silicon 401, it being possible that the consumption of the silicon 401 is clearly reduced or even prevented. Thus the aspect ratio of the nanostructure 2 (as 403a) can also be adjusted by the etching properties and the thickness of the buffer layer 406 as this was described above. The remainders of the buffer layer, represented as 406a, can be removed using the etching selectivity between the buffer layer 406 and the silicon 401 or they can be maintained as this was shown. The use of the buffer layer 406 is in particular advantageous for the use of structural elements with an average height of less than 400 nm, since they can thus be produced as a "surface layer" without any higher consumption of silicon so that the electronic properties in the area at and below the layer are not substantially changed with respect to those of an unstructured surface.

With reference to FIG. 5 further embodiments are described, in which a base nanostructure or a primary structure is modified in order to obtain desired surface properties.

By exposing an existing silicon layer or by applying an additional silicon layer, the subsequent structuring of this layer by means of a RIE process generating the self-organization of needle-type structures with dimensions in the nanometer range below the customary light wavelengths and with a high aspect ratio (nanostructures) without the use of additional means for masking during the structuring process in the chosen areas and modification, e.g. thermal oxidation, of this structured layer a suitable surface, e.g. an $SiO_2$ layer, with approximately the same structure is produced. This layer has a broadband effect of antireflection and can also contribute to an increase in the sensitivity by enlarging the attachment surface of atoms and molecules in sensor components.

In a further embodiment the invention relates to the production of a passivation layer from a desired material such as $SiO_2$ on light-sensitive components and/or components radiating light and also on sensor components. These may both be discrete and monolithically integrated together with semiconductor circuits. The passivation layer consists on its upper side of structures with needle-type tips with a high aspect ratio and, due to this, has a broadband effect of antireflection in the customary wavelength range.

The process according to the invention makes it possible to produce such a surface relief which the means adequate in semiconductor component technology, which is characterized by needle-type structures with high aspect ratios in nanodimensions, i.e. in the range below the customary light wavelengths, with a suitable surface material, e.g. thermal $SiO_2$.

Thus, existing processes of semiconductor technology can be used, no additional disturbances are generated and a layer with a broadband antireflection and/or a large attachment surface is achieved.

When using a modification by means of oxidation the oxygen diffuses in directions into the silicon lattice at the high temperatures of thermal oxidation due to the needle shape of the individual tips. The process takes place everywhere on the large surface. Consequently, the needle structures are oxidized through especially rapidly. The process is easy to use and offers the possibility of forming a secondary nanostructure consisting of $SiO_2$ with relatively little expenditure, which can be produced in a different fashion with a clearly higher expense or only to a limited extent.

The $SiO_2$ layer grows in two directions. On the one hand, it extends into the silicon and, on the other hand, the entire structure grows due to the increase in volume of the $SiO_2$. The silicon is completely or partly converted to $SiO_2$ at least in the tip area. The surface relief of the silicon is transferred to the new $SiO_2$ layer at the same time with it being slightly changed, whereas the boundary surface $Si/SiO_2$ is greatly leveled with respect to the original Si surface.

Other modification processes are carried out in other embodiments such as a nitration, in which nitrogen is included in the silicon in order to change the surface properties therewith. Doping agents or substances for the surface modification or also for changes in material partly reaching deep into the needles may also be introduced.

FIG. 5 illustrates a process sequence. A nanostructure 2 which may be produced by means of the processes described above is formed in an area 503a of a silicon base layer 503 in the upper part of FIG. 5.

The nanostructure 2b is shown in the lower part of the Fig. after it has gone through a modification process which, in this embodiment, may include a thermal oxidation, a plasma oxidation, a wet chemical oxidation and the like.

Due to the greatly rugged surface its surface area is considerably increased, due to which the properties are clearly changed. Gases remain localized in the structure for a quite long period of time. The enlarged surface offers a much larger surface of attack for attaching molecules and, thus, can clearly increase the sensitivity of sensors.

The structures are of interest in the optical field in that their lateral size is smaller than the light wavelength (VIS/NIR) and that they are an almost perfect gradient layer due to their shape and the high aspect ratios. Thus, they make an impedance adaptation possible which results in an excellent broadband reflection suppression without scattering the light.

Since a passivation layer is necessary for most semiconductor components and it can be implemented by means of $SiO_2$, the invention especially also offers itself for optical components. It makes the application of a passivation layer possible without causing the customary reflection losses of 3.5% (transition of $SiO_2$/air).

A further embodiment relates to a process for the passivation of the surface of semiconductor components of silicon by means of an $SiO_2$ layer which has needle-type structures with high aspect ratios in nanodimensions, i.e. in the range below the customary light wavelengths, characterized in that the surface of the silicon is locally exposed and, subsequently, primary needle-type silicon structures with nanodimensions are produced by means of a reactive ion etching process and, subsequently, this structured silicon surface is completely or partly converted to secondary, also needle-type $SiO_2$ structures by means of thermal oxidation.

A further embodiment relates to a process for the passivation of the surface of semiconductor components of silicon by means of an $SiO_2$ layer which has needle-type structures with high aspect ratios in nanodimensions, i.e. in the range below the customary light wavelengths, characterized in that a silicon layer is deposited on the surface and, subsequently, primary needle-type silicon structures with nanodimensions are produced in this silicon layer by means of a reactive ion etching process and, subsequently, this structured silicon layer is completely or partly converted to secondary, also needle-type $SiO_2$ structures by means of thermal oxidation.

In a further embodiment the necessary primary nanostructures in the silicon are produced by means of reactive ion etching (RIE) using the working gases oxygen and $SF_6$ in a single process step without the use of additional means for the targeted mask formation during the structuring process by adjusting the process parameters so that the oxygen in the reaction point on the silicon wafer has a self-masking effect and a self-organization of the needle-type structures takes place.

Now further embodiments of the invention are described with reference to FIGS. 6a to 6c, in which nanostructures on silicon basis are used as optical broadband absorbers.

Silicon surfaces with a self-organized nanostructure produced by means of an RIE process can excellently serve as an absorber, almost all light in the range of from 180 to 1100 nm being absorbed. They are likewise well suited for radiation emission. Due to the application of an additional thin layer the wavelength range of the absorption and emission can still be clearly enlarged.

This aspect relates to the use of structured surfaces of silicon crystal bodies which ensure a light absorption for a large wavelength range, which is as high as possible. For this purpose, the interface properties between the two media need to be changed in such a fashion that no impedance jump, i.e. no instability of the refractive index, occurs between them, but the different impedances continuously pass into each other.

Thus, the advantages are achieved that the needle-type silicon tips with a high aspect ratio form an effective medium in a statistically homogeneous distribution on the surface, which ensures a steady transition of both material properties. Due to this, an absorption of more than 99% can be achieved in the entire visible range for the modification of a silicon surface. Such a good absorption is even achieved beyond the visible range.

Figure 6A:
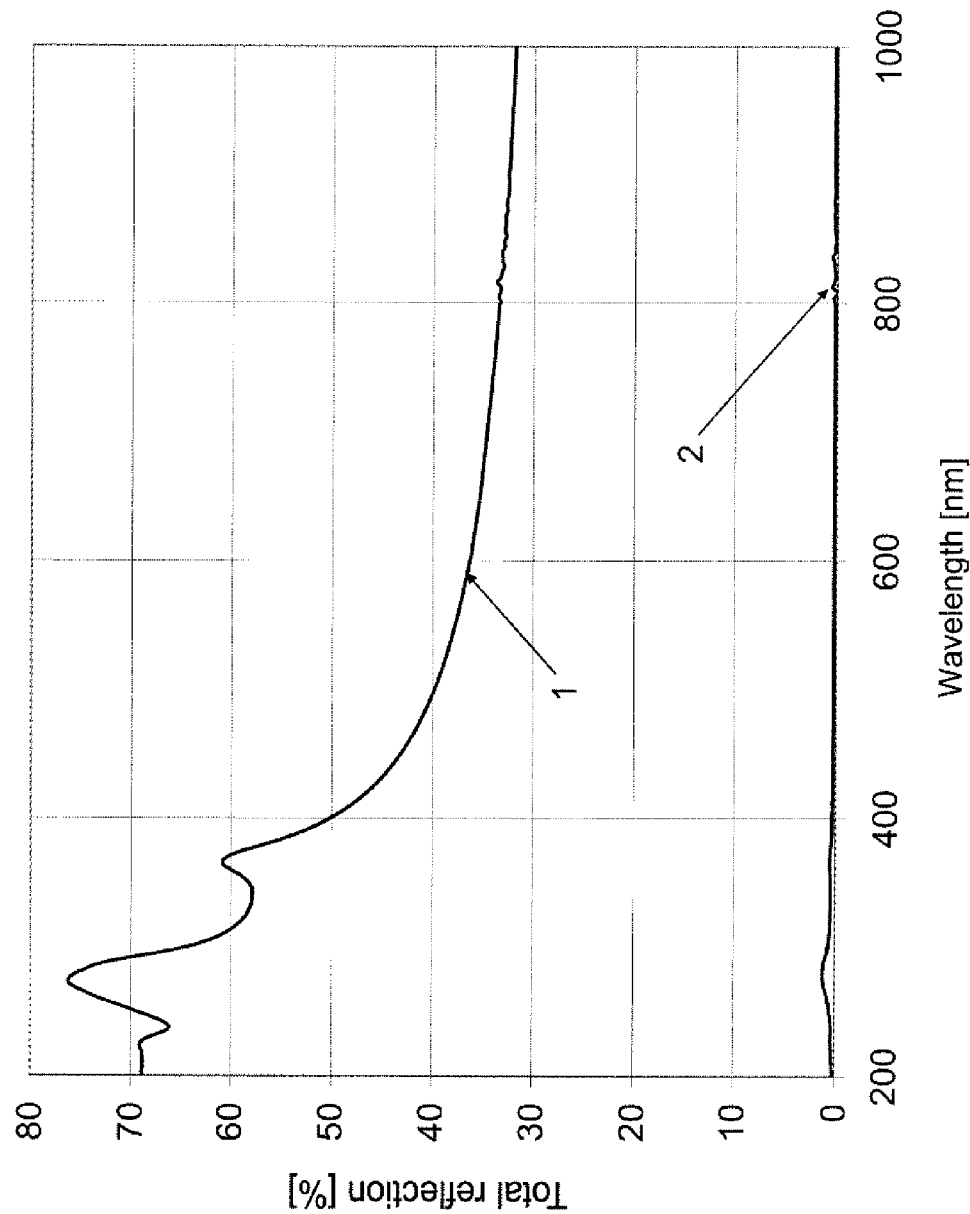
FIG. 6a represents measuring results of the optical reflection of modified silicon surfaces as compared with untreated surfaces, the measuring results having been obtained by means of an Ulbricht sphere and describing the reflections of the surfaces in all space directions.

The measuring results of the optical reflection of modified silicon surfaces as compared with untreated surfaces are shown in FIG. 6a.

Figure 6B:
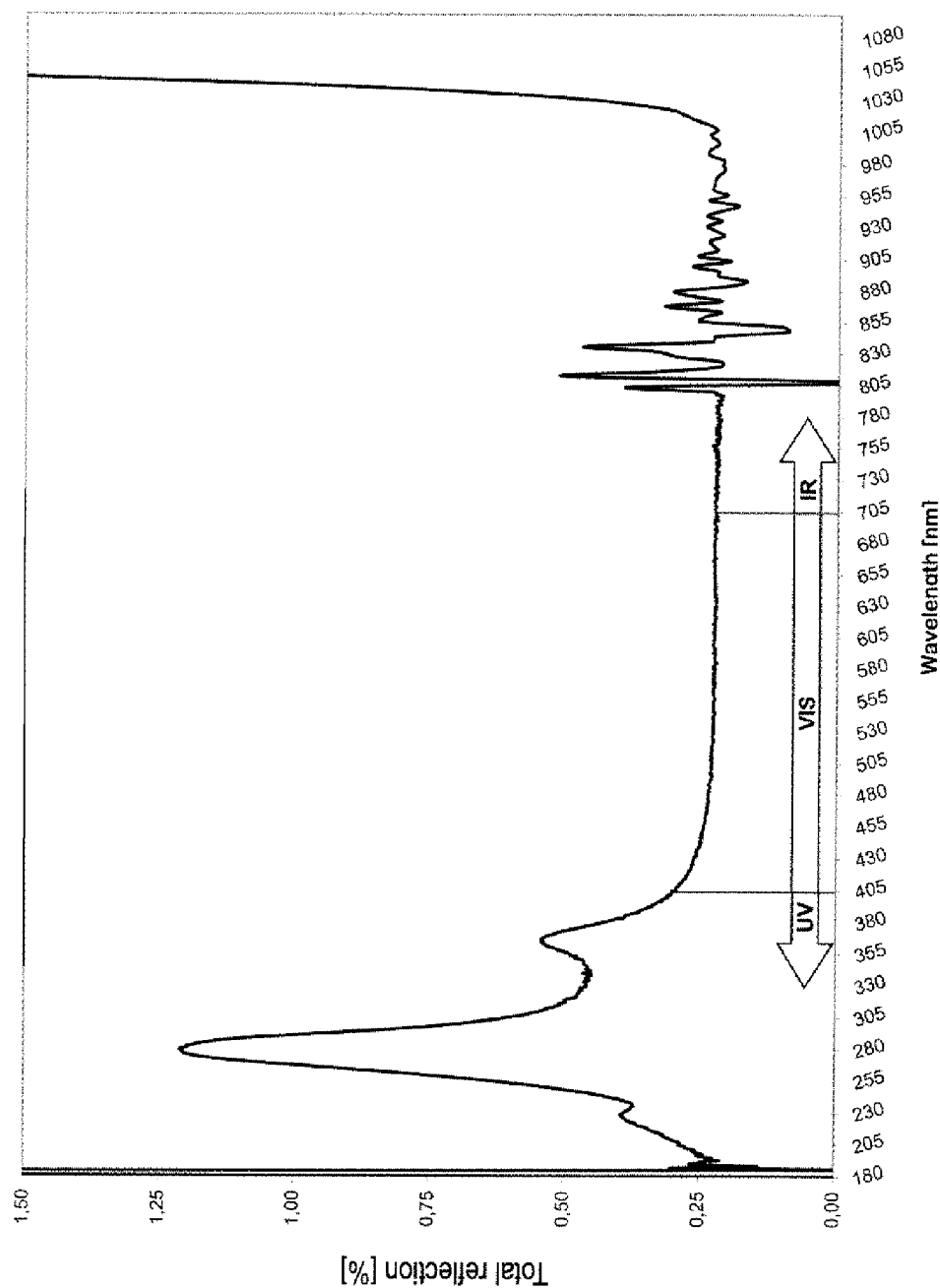
FIG. 6b shows the extremely low and wavelength-independent reflection of the modified silicon surface in a detailed fashion, very low and wave-length independent reflection values occurring in the visible range and the noise above 800 m being attributable to the exchange of the detector in the measuring device.

FIG. 6b shows the extremely low and wavelength-independent reflection of the modified silicon surface in a detailed fashion.

Figure 6C:
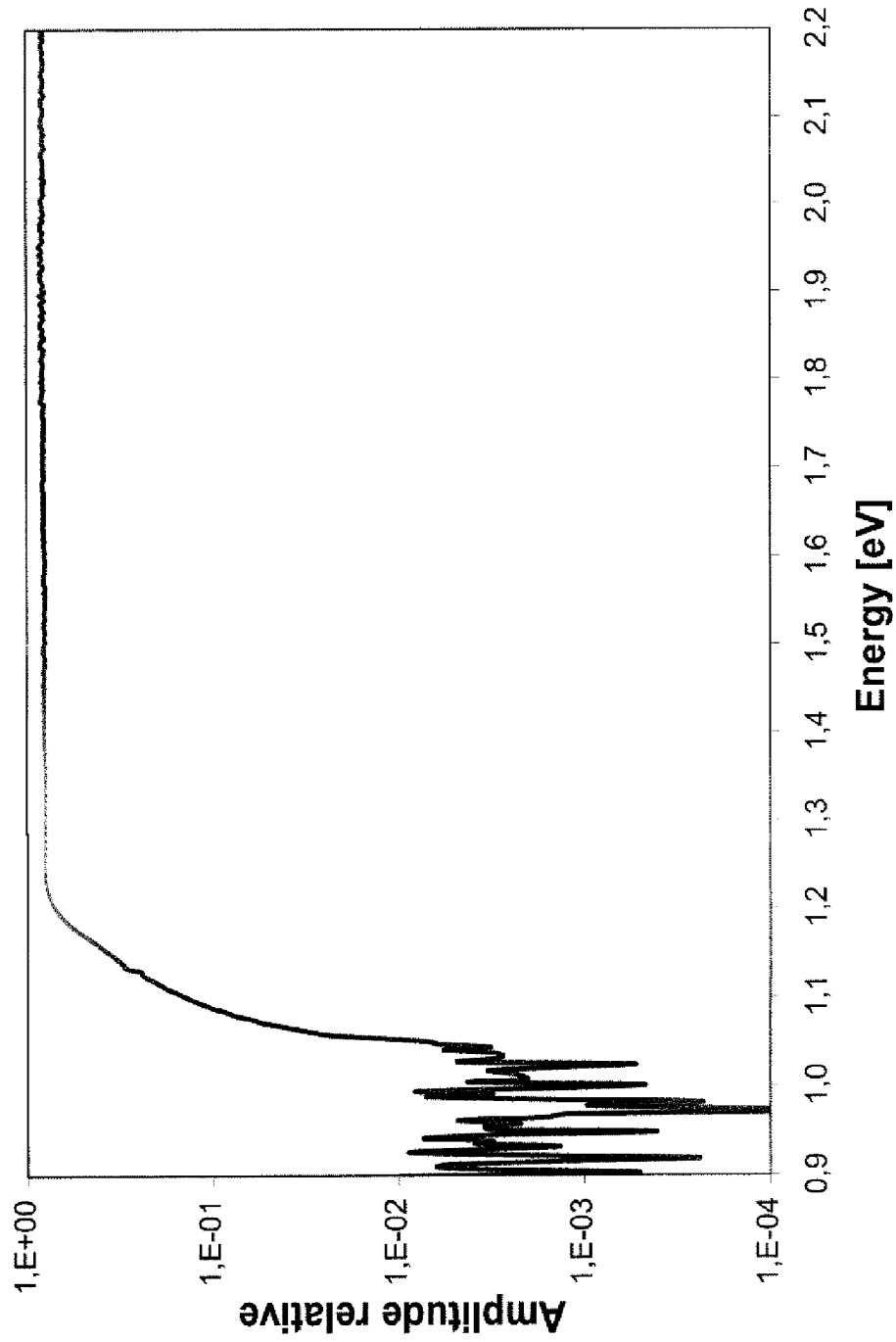
FIG. 6c shows the direct absorption measurement by means of the photothermal deflection spectroscopy (PDS) of a modified silicon surface, an amplitude of "1" corresponding to a 100% absorption (0.9 eV=1350 nm to 2.2 eV=560 nm, the thickness of the sample was 625 μm)

FIG. 6c shows the direct absorption measurement by means of the photothermal deflection spectroscopy (PDS).

Silicon becomes transparent as of a wavelength of 1100 nm and does no longer absorb any light. In order to also still act as an absorber in the wavelength range of more than 1100 nm the structured silicon surface may e.g. be coated with a thin metal layer. Here, the metal takes over the function of the absorbing material, the surface modification being given by the structure in the silicon.

The invention does not only act in one direction, i.e. from material A to material B, but just as well in the reverse direction, from material B to material A. Thus, it also serves for improving the emission in the respective wavelength range.

The special advantage of the self-organized nanostructures on the silicon surface, which absorb in a broadband and efficiently manner, may be advantageously used in many applications. Such layers may preferably be used in optical devices or components. The lining of precision-optical devices or the absorption surface in digital projectors with mirror technology (digital light processing) are mentioned by way of example, in which an absorption of the radiated light, which is as complete as possible, is of importance in order to achieve a contrast value which is as high as possible. Moreover, it is necessary for the color correct representation that the absorption properties are constant across a large wavelength range. Other applications result everywhere where it needs to be ensured that the radiated light is as completely as possible converted to heat in a wavelength-independent fashion. Due to the good broadband properties the invention can also be used as a reflection standard for very low reflection values. A further application is the improved radiation emission as it occurs in optical components such as LEDs or LASERs. An emission of heat radiation is possible due to the metal coating. This can be used for the targeted heat emission or also for the more efficient cooling. A relevant interesting application is the reduction of a cooling surface of a component by means of the improved heat emission.

One embodiment relates to self-organized, needle-type structures in nanodimensions with dimensions that are smaller than the light wavelengths and with an aspect ratio of more than 4:1 with a height of less than 400 nm, which are produced on silicon surfaces with the RIE process, which are produced using the working gases oxygen and $SF_6$ (without the use of additional means for the targeted mask formation) during the etching process in a single process step as this was already explained, these nanostructures in the form of layers being used as optical broadband absorbers for the lining of precision-optical devices.

In a further embodiment the needle-type structures are used as absorption surface in digital projectors with mirror technology (digital light processing).

In a further embodiment the needle-type structures are used for devices, in which the optical radiation is converted to heat as completely as possible in a wavelength-independent fashion.

In a further embodiment the needle-type structures are used for the purpose of the improved radiation emission as it occurs in optical components such as LEDs or LASERs.

In a further embodiment the needle-type structures are used for reflection standards for very low reflection values.

In a further embodiment the needle-type structures are coated with a thin metal layer.

In a further embodiment the metal layer serves for the targeted heat emission.

Figure 7:
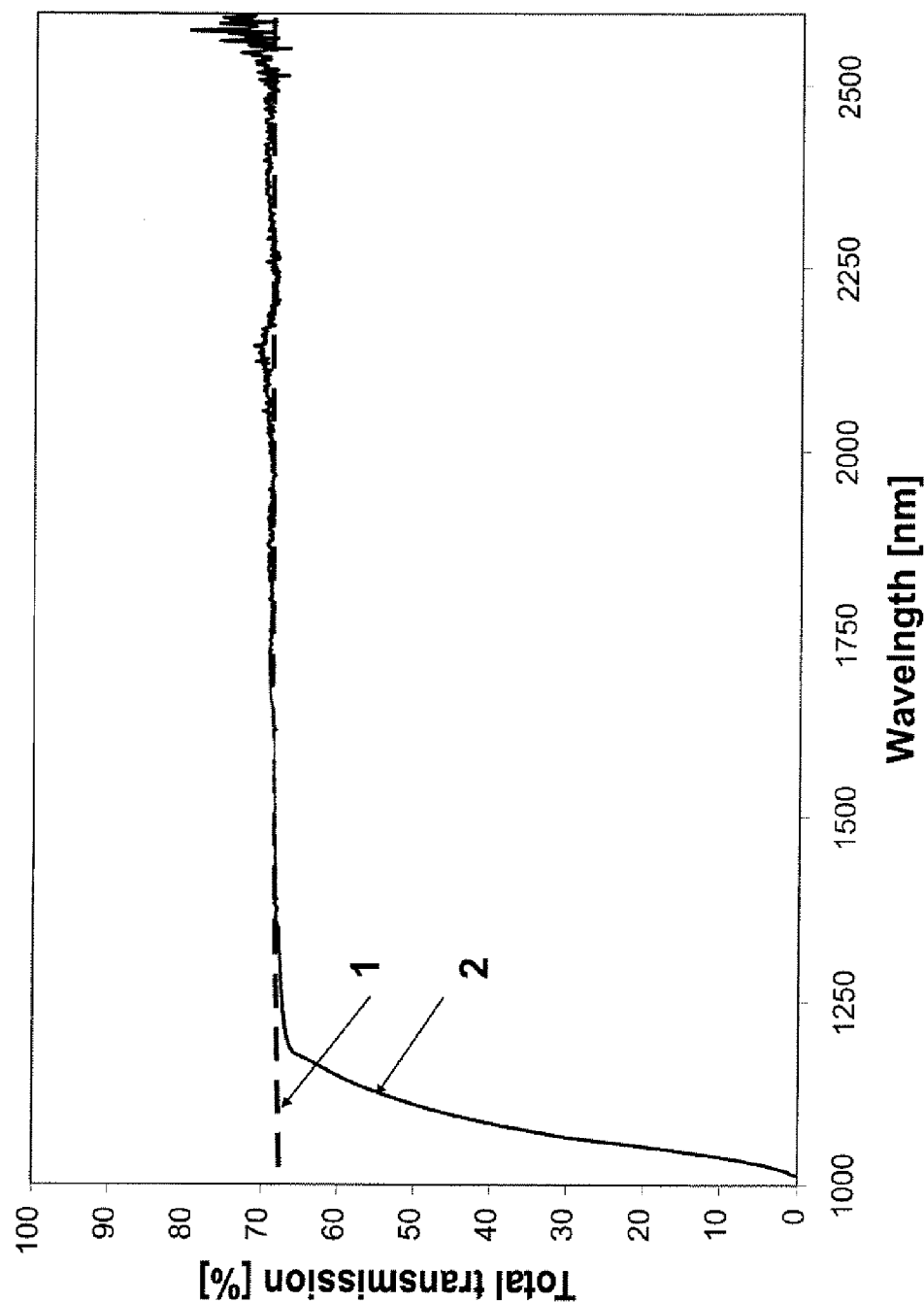
FIG. 7 shows the transparency of a sample with a modified surface on one side, the theoretical curve neglecting the absorption of the silicon.

With reference to FIG. 7 further embodiments are described in which IR windows with a high transmission are made available.

The broadband antireflection of silicon by a self-organized nanostructure produced by means of the RIE process as it was described above can be excellently used as an IR (infrared) window. Here, almost all light in the range above 1100 nm is transmitted.

Silicon can be used as an IR window. Silicon begins to become transparent at a wavelength of larger than 1000 nm and absorbs increasingly less light. Since the air/silicon boundary layer has a reflection of more than 30% and a window always has two boundary surfaces, an untreated piece of silicon only transmits about 50% of the radiated amount of light despite its transparence in the infrared range, the other half is lost due to reflection.

Due to the providing of an IR window on the basis of a nanostructure as it was described above the advantages are achieved that the self-organized nanostructures produced by means of the RIE process form an effective medium which provides for the constant transition of the two material properties. Due to this, a transmission of more than 90% can be achieved in the infrared range with the modification of the silicon surfaces. The modified surface fulfills its task by changing the boundary-layer properties between the silicon and air and/or vacuum so that no impedance jump occurs between them, but the different impedances constantly merge into each other. Here, the material for the desired wavelength range is not absorbing. The modification of the boundary surface of the silicon serves for the suppression of reflection and, thus, the improved transmission.

Here, the shape of the needle-type structures of the surface is of importance. The structures form an effective medium which provides for the constant transition of the two material properties. A one-sided surface modification already reaches a transmission of about 70%.

The transparence of a sample with a surface modified on one side is represented in FIG. 7. The theoretical values of 70% are well obtained for infrared light as of 1200 nm.

The low mechanical stability under load of the produced structures is a problem in the two-sided surface modification so that the handling of the window is rendered more difficult.

The surface modification can be limited to specific areas with conventional photoresist masking techniques so that mechanically strained areas can be easily separated from optically transparent areas. Thus, the disadvantage of the difficult handling is eliminated, a stable, possibly also air-, fluid- or vacuum-tight installation of such a window being readily possible.

One embodiment relates to an optical window of silicon with improved broadband transparence in the IR range, at least one of the two surfaces having needle-type structures in nanodimensions with a high aspect ratio of more than 4:1 and having been produced by means of the RIE process, which were produced using the working gases oxygen and $SF_6$ in a single process step in a self-organizing fashion, as was explained above.

Both surfaces of the window may also be provided with the needles.

In a further embodiment the nanostructures are protected against mechanical destruction with an SOG layer (spin-on glass).

In a further embodiment the protection consists of hydrogen silses quioxane (HSQ).

In a further embodiment the reflection-reducing nanostructuring is limited to specific areas of the window by means of a conventional masking technique in order to thus provide untreated, mechanically stable areas which can be easily sealed against air, fluids and vacuum.

Figure 8:
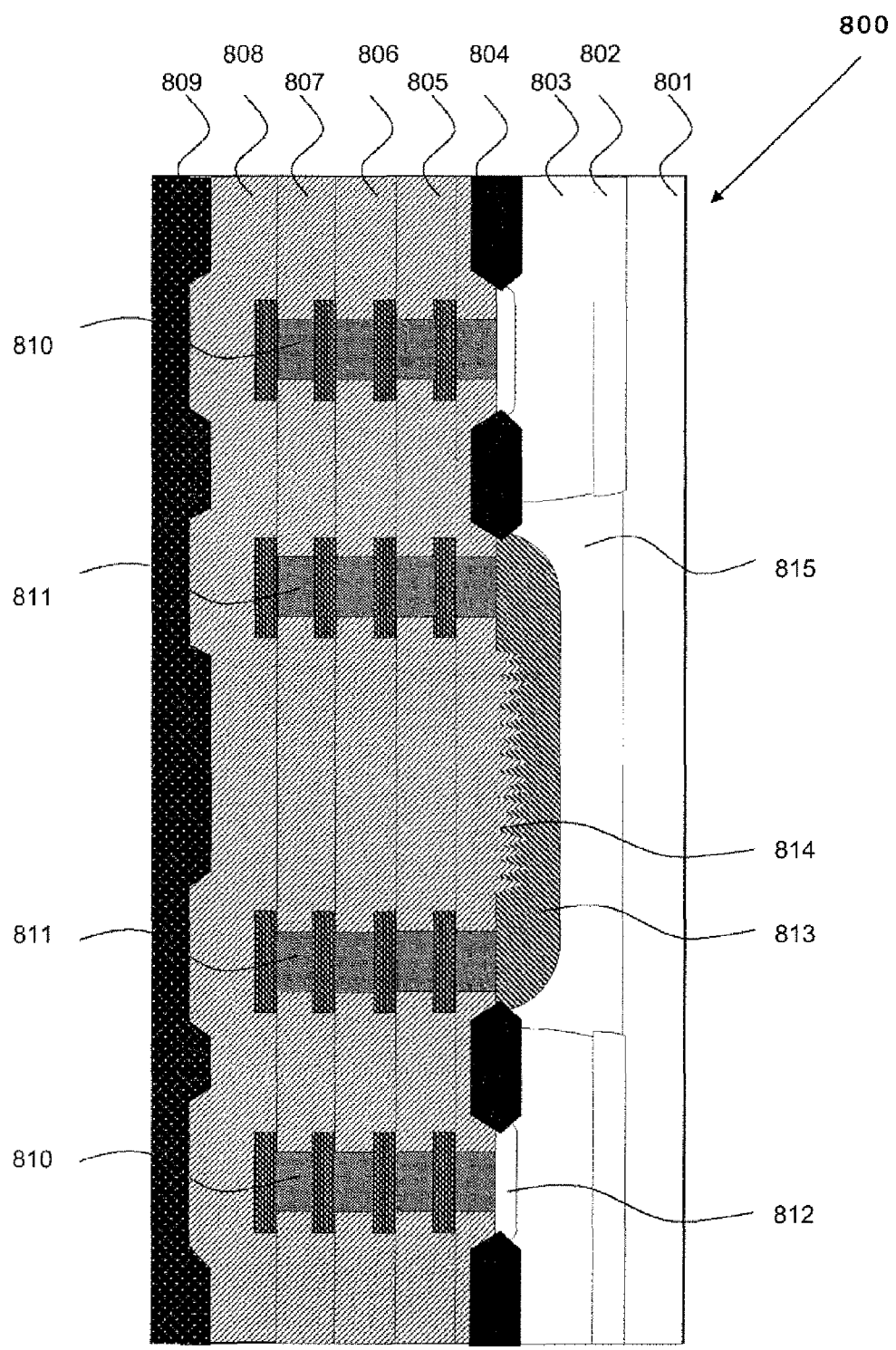
FIG. 8 shows a sectional view of an integrated component which was produced with an optical interface.

Now further embodiments are described with respect to FIG. 8, in which a layer with needle-type structures is produced with an average height in the range of from 200 nm to 1500 nm using the previously described processes. For this purpose, a nanostructure is provided in the optical window of an integrated component before further metallization layers are applied so that the losses in the transition from the metallization planes into the optical window can be reduced without essential restrictions having to be carried out at the metallization plane in the area of the window.

FIG. 8 schematically shows a section through a silicon PIN photodiode 800 which is shown as a component of an integrated circuit (circuit not shown) of a multi-layer metal technology, four metallization planes being shown in the shown embodiment.

The optical component 800 comprises a substrate 801 such as a highly doped p substrate, in which suitably formed semiconductor areas are provided. In the example of a photodiode a p buried layer 802, a p well 803 and an epitaxy area 815 are provided as the intrinsic area of the diode 800. Moreover, strongly p doped areas 813 are provided for contacting the areas 803. A strongly n doped area 813 is formed in the epitaxy area 815 and has a layer with a needle structure 814, the layer having a thickness in the range of from 200 to 1500 nm. Moreover, various areas are separated by insulation structures 804 in the component plane.

A metallization structure is provided on the component layer (the substrate) 801 in connection with other semiconductor areas in order to connect the individual components, e.g. the diode 800, with other elements and the periphery. Four metallization planes are provided in the shown embodiment, which have a respective insulation layer, i.e. layers 805, 806, 807, 808, in which leads and other metal areas are formed such as corresponding electrodes 810, 811 which serve as the anode and/or cathode. The insulation layers are built up from a suitable material such as silicon oxide or the like, preferably (thermally) oxidized at temperatures of less than 500° C. Moreover, a final passivation layer 809 is provided which protects the integrated circuit against environmental influences.

The component may be produced in accordance with conventional processes, which is then followed by a further etching step as this was also already explained above, in which the corresponding needle structure 814 is produced in the surface area of the photodiode 800. This is followed by process steps for the application of the respective insulation layer and the corresponding metal areas. In one embodiment the insulation layers are applied as materials which have a very similar refractive index (e.g. $SiO_2$). A further layer with a nanostructure may be applied on an insulation layer in other embodiments, if the directly following layer has a very different refractive index. If. e.g. a silicon nitride layer is to follow as the next layer, a nanostructure may be produced in the preceding oxide layer by e.g. depositing, structuring and then modifying a silicon layer as this was also previously described.

The layer thickness of the nanostructure layer 814 can be selected in accordance with the examples of FIG. 1b or in accordance with FIGS. 1h, 1i. Correspondingly thinner layer thicknesses may be provided, e.g. of less than 400 nm or in the range of from 300 nm to 350 nm.

The passivation layer 9 may also be produced from a material with a very similar refractive index (e.g. again $SiO_2$) or a further layer with a nanostructure may be provided for the adaptation of the refractive index in the manner described above.

A photodiode of an integrated circuit, which is built up in this fashion has the following advantages:

The structure of the insulation layers, i.e. their number, thickness, etc. is negligible. Thus, it is of no importance whether the chip is e.g. produced in 2-layer metallization or in a 6-layer metallization.

The insulation layers and the passivation layer may not be removed by etching in order to apply a defined layer thickness for a $\lambda/4$ layer. Such a step of removal by etching as it is described in DE-A 102 396 43 is very expensive for multilayer technologies.

If a photodiode is not operated in air, but directly coupled to glass, there are no transition losses. If e.g. a glass fiber is directly glued onto the $SiO_2$ passivation or a glass lid of the chip housing is directly applied onto the passivation layer, there are insignificant transition losses as far as into the silicon. This property can hardly be achieved with a $\lambda/4$ antireflection even for a very small wavelength range.

Due to the optional design of the insulation layer a very smooth glass surface for the entire process wafer can be produced by means of CMP (chemo mechanical polishing). Due to this, integrated circuits with photodiodes can thus be further processed as if they were glass substrates. High-quality dielectric layer systems can easily directly applied for the entire process wafer and even structured. Thus, cost savings are possible Microlenses can be directly applied for the entire process wafer. Micro optics can be mounted for an entire process wafer. This is also possible for changing semiconductor technologies with the conditions remaining the same, i.e. for different structure sizes, different metallization systems and different photodiodes.

One or several "optical elements" are allocated to an optical component on the substrate and affixed prior to the separation of the substrate, on which the optical components had been previously produced. Examples of one of these optical elements each are beam dividers, polarisators, optical filters, refraction lattices, waveguides, prisms, lenses, glass fibers, protective glasses, liquid crystals, diaphragms, photonic crystals, dielectric layers, absorbing layers, LEDs, LASERs, attenuators, modulators, fluorescent substances, conductive electrode materials. Several different optical elements may be used per substrate and several different optical elements may also be connected per optical component or one optical element is disposed on the substrate per optical component.

We claim:

1. A photoelectronic component comprising:
   an optically active window for at least one of the entry and exit of radiation;
   a nanostructure with statistically distributed structural elements with the upper end area and a lower base area, which on average, have a height of less than 400 nm, provided in an optically active window and wherein an aspect ratio of the structural elements as the ratio of the heights of the structural elements to their lateral extensions at the base areas is, on average, higher than four.

2. The photoelectronic component according to claim 1, which further comprises a passivation layer which leaves the optically active window free and forms a boundary with it, wherein the structural elements substantially extend up to the boundary.

3. The photoelectronic component according to claim 1, wherein the structural elements are built up from monocrystalline semiconductor material.

4. The photoelectronic component according to claim 3, wherein the nanostructure has a monocrystalline base layer on which the structural elements are arranged and wherein a crystal defect density of the structural elements is substantially equal to the crystal defect density of the base layer.

5. The photoelectronic component according to claim 3, wherein the semiconductor material is silicon.

6. The photoelectronic component according to claim 1, wherein the structural elements are at least partly built up from an insulating material.

7. The photoelectronic component according to claim 6, wherein the insulating material is silicon dioxide or silicon nitride or silicon oxynitride.

8. The photoelectronic component according to claim 1, wherein the height of the structural elements is in the range of from more than 300 nm to less than 400 nanometers, in particular in the range of less than 350 nm.

9. The photoelectronic component according to claim 1, which further comprises a leveling layer in the optically active window, wherein the structural elements of the nanostructure are embedded in the leveling layer.

10. The photoelectronic component according to claim 9, wherein the material of the leveling layer has a refractive index of 1.5 or less.

11. The photoelectronic component according to claim 1, wherein a second nanostructure is moreover provided on a second interface of the optically active window.

12. The photoelectronic component according to claim 11, wherein the second nanostructure is embedded in a protective layer.

13. The component according to claim 1, wherein the nanostructure is attached to one surface of the optically active window.

14. A sensor component comprising
   a sensor surface which is formed by a nanostructure with statistically distributed structural elements, wherein the structural elements have an end area and a base area and, on average, a height of less than 400 nm and wherein an aspect ratio of the structural elements—the ratio of the height of the structural elements to the lateral extension at the base area—is, on average, higher than four.

15. The sensor component according to claim 14, wherein the sensor surface is formed from an insulating material.

16. The sensor component according to claim 14, which further comprises a porous leveling layer for embedding the nanostructure.

17. The sensor component according to claim 14, wherein the structural elements are at least partly built up from silicon.

18. The sensor component according to claim 14, wherein the height of the structural elements is in the range of more than 300 nanometers and less than 400 nanometers, the height being in particular less than 350 nm on average.

19. An optical coating structure for use in optical components or optical devices, comprising
a base layer and
a nanostructure with statistically distributed structural elements, which is applied onto the base layer, wherein the structural elements each have an upper end area and a lower base area and, on average, a height of less than 400 nm and wherein the aspect ratio of the structural elements, in each case as a ratio of the height of a structure element and its lateral extension in the base area, is, on average, higher than four.

20. The optical coating structure according to claim 19, wherein the structural elements are built up from monocrystalline semiconductor material.

21. The optical coating structure according to claim 20, wherein the base layer is monocrystalline and wherein a crystal defect density of the structural elements is substantially equal to the crystal defect density of the base layer.

22. The optical coating structure according to claim 20, wherein the semiconductor material is silicon.

23. The optical coating structure according to claim 19, wherein the structural elements are at least partly built up from an insulating material, the insulating material being in particular silicon dioxide.

24. The optical coating structure according to claim 19, wherein base areas (4b) and upper end areas (4a) as the end areas of the structural elements have in each case a gentle approximation to the respective medium outside the structural elements (4) or reaches it above and/or below these structural elements.

25. The optical coating structure according to claim 19, wherein the height of the structural elements is, on average, in the range of more than 300 and less than 400 nanometers and/or, is, on average, less than 350 nm.

26. The optical coating structure according to claim 19, which further comprises a leveling layer, wherein the structural elements of the nanostructure are embedded in the leveling layer.

27. The optical coating structure according to claim 26, wherein the material of the leveling layer has a refractive index of 1.5 or less.

28. The optical coating structure according to claim 19, wherein a conformal metal layer is applied onto the structural elements.

29. The optical coating structure according to claim 28, wherein the metal layer serves for the targeted heat emission or heat absorption.

30. An optical device comprising a lining as an optical broadband absorber, wherein the lining comprises an optical coating structure according to claim 19.

31. A digital projector with mirror technology (digital light processing) having an absorption surface which comprises an optical coating structure according to claim 19.

32. A device comprising a means for the wavelength-independent conversion of optical radiation to heat, wherein the means for the conversion of optical radiation to heat comprises an optical coating structure according to claim 19.

33. An optical element for the emission of optical radiation comprising an exit window which comprises an optical coating structure according to claim 19.

34. The optical element according to claim 33, wherein the exit window is coupled to a light-emitting diode or a LASER.

35. A reflection reference means for determining low reflection values, wherein the means comprises an optical coating structure according to claim 19.

36. The optical coating structure according to claim 19, wherein the base layer has a (globally) bent surface so that the nanostructure with the structural elements which, on average have a height of less than 400 nm, but more than 300 nm, also extends in a bent fashion.

37. The optical coating structure according to claim 36, wherein the bent surface represents a microlens.

* * * * *